(12) United States Patent
Kamikawa et al.

(10) Patent No.: US 6,861,371 B2  
(45) Date of Patent: Mar. 1, 2005

(54) SUBSTRATE PROCESSING SYSTEM AND SUBSTRATE PROCESSING METHOD

(75) Inventors: Yuji Kamikawa, Tosu (JP); Eiichi Mukai, Tosu (JP)

(73) Assignee: Tokyo Electron Limited, Tokyo-To (JP)

(*) Notice: Subject to any disclaimer, the term of this patent is extended or adjusted under 35 U.S.C. 154(b) by 0 days.

(21) Appl. No.: 10/285,410

(22) Filed: Nov. 1, 2002

(65) Prior Publication Data

US 2003/0084929 A1 May 8, 2003

(30) Foreign Application Priority Data

Nov. 5, 2001 (JP) .................................... 2001-339011

(51) Int. Cl.[7] ...................... H01L 21/302; H01L 21/401
(52) U.S. Cl. .................. 438/747; 438/745; 438/905; 134/104.4; 134/104.1
(58) Field of Search ........................ 438/747, 745, 438/905, 907; 134/104.4, 104.1, 110, 61, 1.3

(56) References Cited

U.S. PATENT DOCUMENTS 5,059,331 A * 10/1991 Goyal ...................... 210/748
6,074,561 A * 6/2000 Jablonsky ................ 210/650

FOREIGN PATENT DOCUMENTS

| JP | 2001-120964 | 5/2001 |
| JP | 2002-075957 | 3/2002 |

* cited by examiner

Primary Examiner—Caridad Everhart  
(74) Attorney, Agent, or Firm—Smith, Gambrell & Russell, LLP

(57) ABSTRACT

The present invention provides a substrate processing system and method which can prevent the filter from being stuffed with foreign objects and make the filter accordingly more durable.

The substrate processing system 12 comprising a substrate processing unit 46 for processing substrates W with a processing liquid, and a processing liquid recovery passage 75 for passing the processing liquid discharged from the substrate processing unit 46, in which the processing liquid recovery passage 75 includes a filter 80 for removing foreign objects mixed in the processing liquid, a cleaning fluid supply passage 120 for feeding a cleaning fluid for cleaning the filter 80, and a discharge passage 115 for discharging the processing liquid and the cleaning fluid from the filter 80.

22 Claims, 12 Drawing Sheets

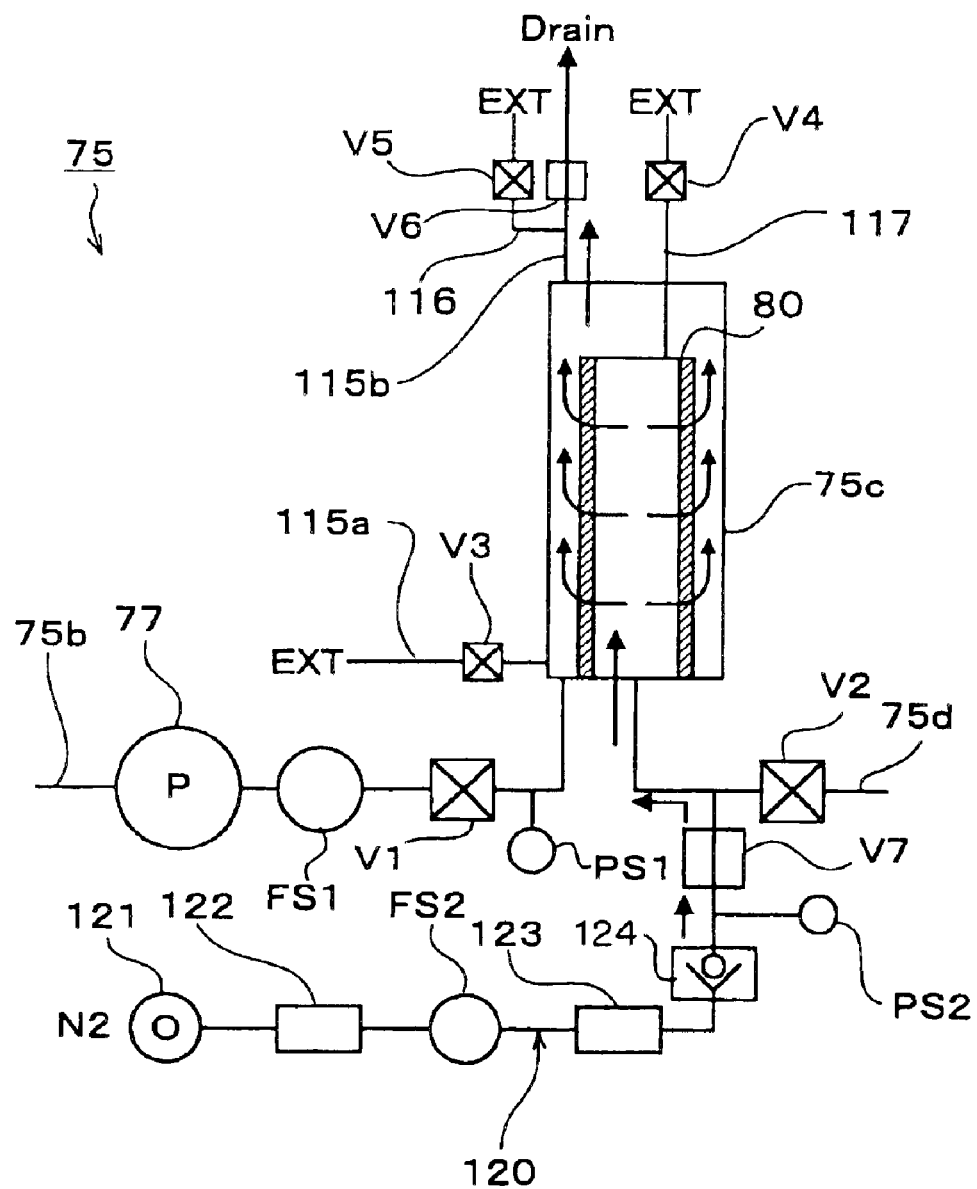
F I G. 7

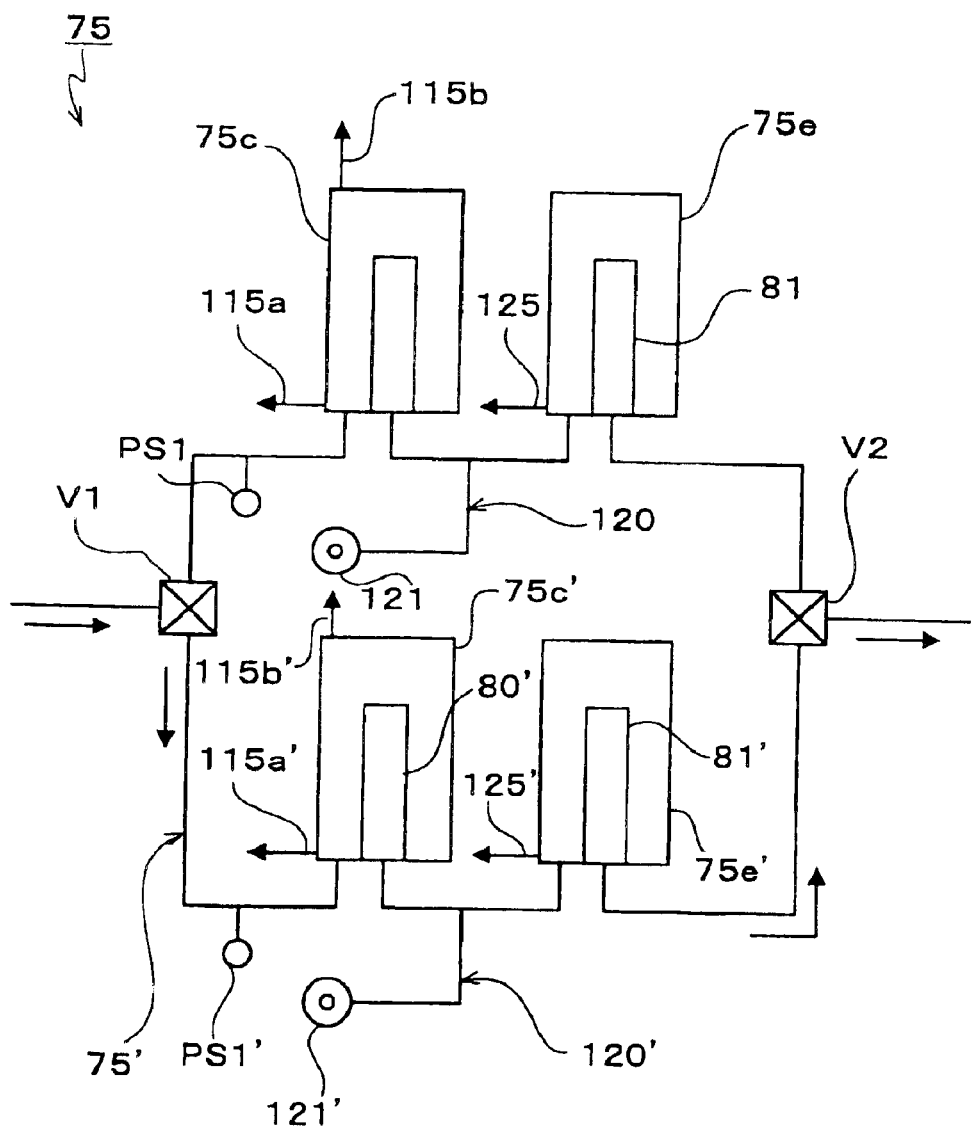
F I G. 10

SUBSTRATE PROCESSING SYSTEM AND SUBSTRATE PROCESSING METHOD

CROSS REFERENCE TO RELATED APPLICATIONS

The subject application is related to subject matter disclosed in Japanese Patent Application No. 2001-339011 filed on Nov. 5, 2001 to which the subject application claims priority under Paris Convention and which is incorporated herein by reference.

BACKGROUND OF THE INVENTION

1. Field of the Invention

The present invention relates to a substrate processing system and a substrate processing method for subjecting, e.g., semiconductor wafers, glass for LCD substrates, etc. to cleaning and other treatments.

2. Related Background Art

Substrate processing systems for subjecting various treatments to semiconductor wafers (hereinafter called "wafers") in, e.g., semiconductor device fabrication processes include processing liquid circuits for reusing processing liquids to be fed to the wafers. The processing liquid circuits include filters for removing foreign objects, etc. mixed in the processing liquids which have been used in processing the wafers, so that the processing liquids are purified to be fed again to the wafers. Foreign objects which are mixed in the processing liquids are, e.g., decomposed resist films. This foreign object is found in the step of feeding an organic solvent or a releasing chemical liquid to a resist applied to wafers to dissolve and remove the resist. That is, polymers produced on the surface of the resist film or decomposed resist film is not completely dissolved in the chemical liquid but peel off the wafers in film or colloidal foreign objects to be discharged together with the processing liquids which have been used in the processing. A filter for removing such foreign object, e.g., a cylindrical filter member is disposed in a housing, in which processing liquids containing the foreign objects are passed through the filter member from the outer circumference of the filter member to the inside thereof to thereby trap the foreign object on the outer circumference.

However, in the conventional substrate cleaning processing system, it is a problem that relatively large foreign objects fill the filter, specifically peeled polymers and decomposed resists, which are colloidal foreign objects, easily fill the filter. The filter is required to be frequently replaced, which is a cause for cost increase. The operation of replacing the filter interrupts the wafer cleaning processing, which is a cause for decrease of the throughput of the wafer processing as a whole.

SUMMARY OF THE INVENTION

An object of the present invention is to provide a substrate processing system and method which can prevent the filter from being stuffed with foreign objects and make the filter accordingly more durable.

The present invention provides a substrate processing system comprising a substrate processing unit for processing a substrate with a processing liquid, and a processing liquid recovery passage for the processing liquid discharged from the substrate processing unit to flow through, in which the processing liquid recovery passage includes a filter for removing foreign objects mixed in the processing liquid; a cleaning fluid supply passage for feeding a cleaning fluid for cleaning the filter; and a discharge passage for discharging the foreign objects and the cleaning fluid from the filter.

In the substrate processing system, a cleaning fluid is passed through the filter to remove the foreign objects stuffing the filter and discharge the foreign objects through the discharge passage. Accordingly, the filter is prevented from being stuffed with foreign objects without frequently replacing the filter.

It is preferable that the filter is a cylindrical filter member, and that the processing liquid passes through the cylindrical member from the outer circumferential surface to the inside, and the cleaning fluid passes through the cylindrical member from the inside to the outer circumferential surface. The foreign objects are released by the cleaning fluid to remove the foreign objects, whereby the filter is cleaned.

It is preferable that the filter is a cylindrical filter member, and the cylindrical filter member is formed in replaceable cartridges. The filter can be very easily replaced.

It is preferable that the filter includes a cylindrical member, and a housing enclosing the filter member, and an upper discharge passage for discharging the foreign objects and the cleaning fluid at the upper side of the housing, and a lower discharge passage for discharging the foreign objects and the cleaning fluid at a lower part of the housing. The foreign objects in the housing can be efficiently discharged together with the processing liquid and the cleaning fluid.

It is preferable that an additional finer filter than the filter is disposed downstream of said filter of the processing liquid recovery passage. The coarse filter for trapping large foreign objects is disposed upstream, whereby the fine filter which can provide required cleanliness can be made more durable.

It is preferable that the filter is a cylindrical filter member, an additional filter of a cylindrical finer filter member than said filter is disposed inside said filter, the processing liquid passes through the outer filter from the outer circumferential surface of the cylindrical filter member to the inside and passes the additional filter from the outer circumferential surface to the inside, and the cleaning fluid passes through the outer filter from the inside of the cylindrical member to the outer circumferential surface. The coarse filter for trapping large foreign objects is disposed outside, whereby the fine filter which can provide required cleanliness can be made more durable. The cleaning fluid is passed through the outside filter to thereby remove the foreign objects stuffing the outer filter, whereby the filter is prevented from being stuffed with foreign objects without frequently being replaced.

To attain the above-described object, the present invention provides a substrate processing system comprising a substrate processing unit for processing a substrate with a processing liquid, and a plurality of processing liquid recovery passages for the processing liquid discharged from the substrate processing unit to flow through, in which each of the plurality of processing liquid recovery passages includes a filter for removing foreign objects mixed in the processing liquid, a cleaning fluid supply passage for feeding a cleaning fluid for cleaning the filter, and a discharge passage for discharging the foreign objects and the cleaning fluid from the filter. In the substrate processing system, when foreign objects removed from the processing liquid are accumulated on the filter, the filter can be changed over so that the processing liquid passes through the filter disposed in another processing liquid recovery passage, whereby the liquid delivery step through the processing liquid recovery passage can be continued. While the liquid delivery is being continued, the filter with foreign objects accumulated on can be cleaned. It is preferable that each of the plurality of processing liquid recovery passage includes an additional finer filter than said filter disposed downstream of said filter. The coarse filter for trapping large foreign objects is disposed upstream in each processing liquid recovery passage, whereby the fine filter which can provide required cleanliness can be made more durable.

It is preferable that a liquid delivery pump for delivering the processing liquid to the filter is disposed upstream of the filter. It is preferable that an additional finer filer than said filter is disposed downstream of said filter of the processing liquid recovery passage; at least one additional processing liquid recovery passage is branched from a part of the processing liquid recovery passage between said filter and the liquid delivery pump and is connected to a part of the processing liquid recovery passage between the filter and the additional filter, and the additional processing recovery passage includes a filter for removing foreign objects mixed in the processing liquid, a cleaning fluid supply passage for feeding a cleaning fluid for cleaning the filter of the additional processing recovery passage, and a discharge passage for discharging the foreign objects and the cleaning fluid from the filter of the additional processing recovery passage. When foreign objects are accumulated on one of the upstream filters on which foreign objects tend to accumulate, the filter is changed over for the processing liquid to pass through another processing liquid recovery passage, and while the processing is being continued, the filter with the foreign objects accumulated on can be cleaned.

It is preferable that a pressure sensor for metering a pressure of the processing liquid and/or a flow sensor for metering a flow rate of the processing liquid is disposed between the liquid delivery pump and the filter. Accumulated amounts of foreign objects trapped by the filter can be estimated based on metered pressures and/or flow rates.

It is preferable that a pressure sensor and/or a flow sensor is disposed in the cleaning fluid supply passage. Pressured and flow rates of the cleaning fluid depend on amounts of foreign objects released from the filter, which permits a cleaned state of the filter to be estimated.

It is possible that the filter includes a supersonic vibrator or a sonic vibrator of a 10–100 Hz frequency. Supersonic vibrations and sonic vibrations of a 10–100 Hz frequency enhance the release of foreign objects from the filter.

It is preferable that the filter includes a heater. Heat of the heater enhances the release of foreign objects from the filter.

It is preferable that the substrate processing system comprises a control unit for controlling a cleaning step for cleaning the filter, and the control unit counts times of cleaning the filter and outputs a message for replacing the filter when the times reach a prescribed times. The filter is replaced every prescribed cleaning times, which prevents the filter from being stuffed.

It is preferable that the control unit commands the start of the cleaning step of cleaning the filter at a prescribed time interval. The filter is cleaned at a prescribed time interval, which can prevent the filter from being stuffed.

It is preferable that the filter includes a color sensor. The color sensor can detect accumulation of foreign objects on the filter, which can prevent the filter from being stuffed.

It is preferable that the housing enclosing the filter has a window for visually observing the filter. Accumulation of foreign objects on the filter can be visually confirmed through the window, which can prevent the filter from being stuffed. The present invention provides a substrate processing method for processing a substrate with a processing liquid, passing the processing liquid discharged after the processing through a filter to remove foreign objects in the processing liquid, in which when the filter is stuffed with foreign objects, a cleaning fluid is passed through the filter in a direction opposite to a direction of passage of the processing liquid to thereby release the foreign objects. When the filter is stuffed, the cleaning fluid is passed through the filter in a direction opposite to passage of the processing liquid to thereby release the objects.

It is preferable that the substrate processing method comprises the step of discharging the cleaning fluid which has passed through the filter and the foreign objects released from the filter at an upper part of a housing enclosing the filter, and the step of discharging the cleaning fluid which has passed through the filter and the foreign objects released from the filter at a lower part of the housing. According to this invention, even when foreign objects settle near the bottom of the filter, the foreign objects can be discharged.

It is preferable that the substrate processing method comprises the step of discharging the cleaning fluid which has passed through the filter and the foreign objects released from the filter at an upper part of a housing enclosing the filter, and the step of discharging the cleaning fluid which has passed through the filter and the foreign objects released from the filter at a lower part of the housing, in which in the latter step, the processing liquid is delivered into the housing. Foreign objects settling on the bottom of the housing can be flushed away with a small amount of the processing liquid to thereby discharge the foreign objects.

It is preferable that when a pressure of the processing liquid before passing through the filter increases or when a flow rate of the processing liquid decreases, the step of releasing the foreign objects on the filter is started. It is preferable that when a pressure of the cleaning fluid before passing through the filter decreases or when a flow rate of the cleaning fluid increases, the step of releasing the foreign objects on the filter is stopped.

It is preferable that the cleaning fluid is $N_2$, isopropyl alcohol (IPA) or pure water. It is preferable that the cleaning fluid is a gas containing an organic solvent.

BRIEF DESCRIPTION OF THE DRAWINGS

FIG. 7 is a view explaining a blow cleaning step of blowing $N_2$ gas to the filter to discharge foreign objects at the upper part of the housing.

FIG. 10 is a view diagrammatically explaining the arrangement of two purifying filters and the filters disposed upstream of the respective purifying filters.

DESCRIPTION OF THE PREFERRED EMBODIMENTS

Figure 1:
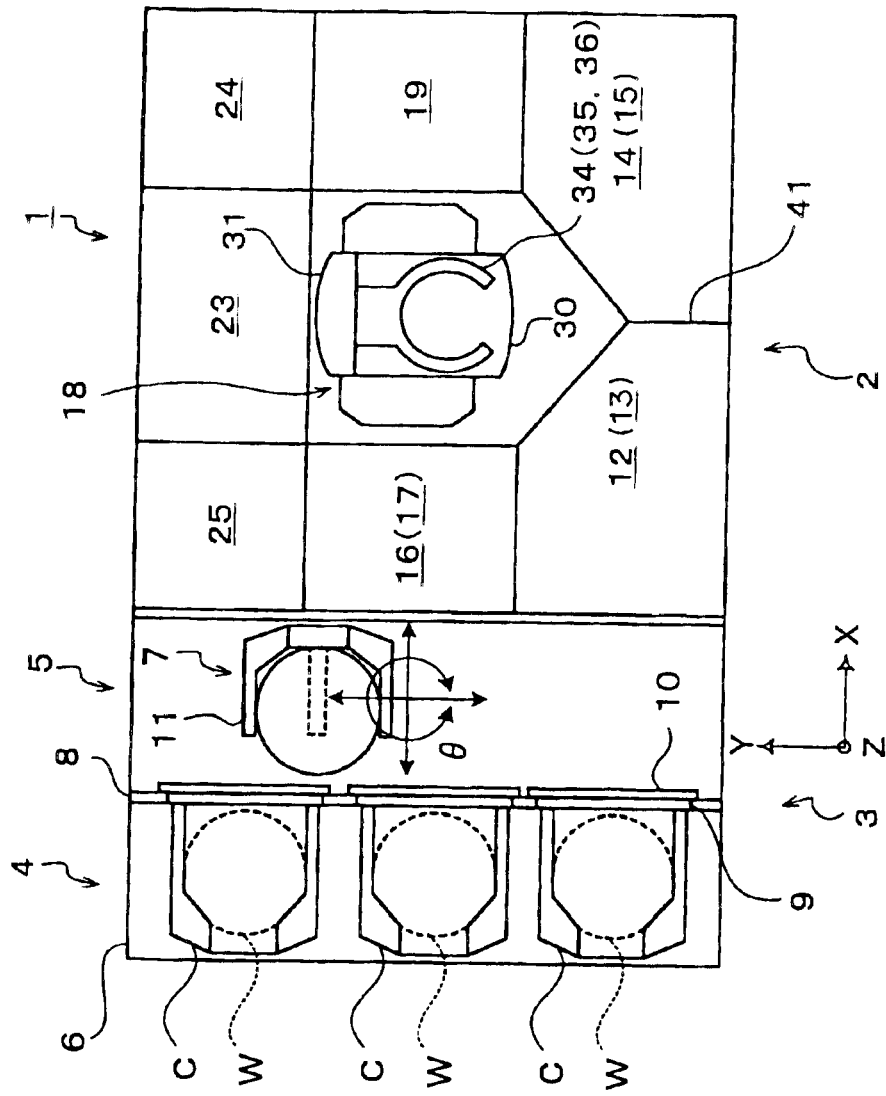
FIG. 1 is a plan view of the processing system
Figure 2:
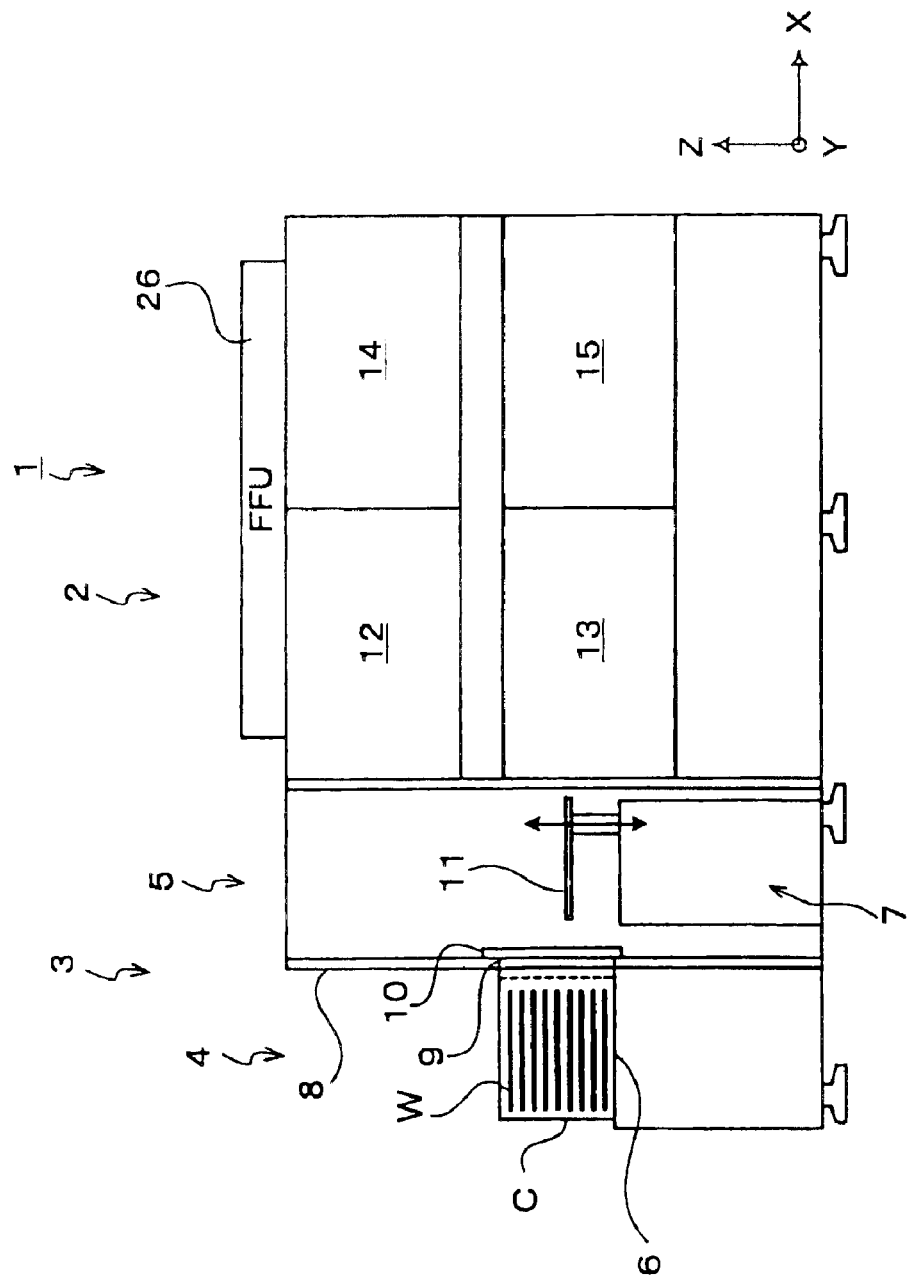
FIG. 2 is a side view of the processing system.

A preferred embodiment of the present invention will be explained below by means of substrate processing units as substrate processing apparatuses for processing the surfaces of wafers as one example of substrates to remove resists, etc. FIG. 1 is a plan view of the substrate processing system 1 incorporating the substrate processing units 12, 13, 14, 15. FIG. 2 is a side view of the substrate processing system. The processing system 1 comprises a processing unit 2 for processing wafers W to remove resists, and a load/unload unit 3 for loading/unloading wafers W into/out of the processing unit 2.

The load-unload unit 3 comprises an in/out port 4 including mounts 6 for containers (carriers C) to be mounted on, which can contain a plurality, e.g., 25 sheets, of wafers W horizontally and at a prescribed space, and a wafer carriage unit 5 including a wafer carrier apparatus 7 which transfers the wafers between the carriers C and the processing unit 2.

Wafers W are loaded into each carrier C through one side thereof, and an openable lid is provided on the side. Shelf plates for holding wafers W at the prescribed space are provided on the inside wall of each carrier C, defining 25 slots for holding the wafers W. Wafers W are respectively held in the respective slots with the front surfaces (the surfaces for a semiconductor device to be fabricated on) of the wafers faced upward (i.e., the front surfaces are the upper surfaces of wafers W held horizontally).

Three carriers, for example, can be mounted on the mounts 6 of the in/out port 4, arranged in the Y direction with respect to the horizontal plane. The carriers C are mounted with the covers opposed to the partition wall 8 between the in/out port 4 and the wafer carriage unit 5. Windows 9 are formed in the partition wall 8 at positions corresponding to the mounted positions of the carriers C. Window opening/closing mechanisms 10 for opening/closing the windows 9 by shutter or others are provided on the side of the windows 9 opposed to the wafer carriage unit 5.

The window opening/closing mechanisms 10 can open also the cap of the carriers C, and open/close the caps of the carriers C concurrently with opening/closing of the windows 9. When the windows are opened to make the wafer loading/unloading openings of the carriers C communicated with the wafer carriage unit 5, the access of the wafer carrier apparatus 7 of the wafer carriage unit 5 to the carriers C is permitted, and the state where wafers W are ready to be carried is set.

The wafer carrier apparatus 7 disposed in the wafer carriage unit 5 is movable in the Y-direction and the Z-direction and is rotatable in the X-Y plane (in the direction of θ). The wafer carrier apparatus 7 has a take-out/take-in arm 11 for gripping a wafer W, and the take-out/take-in arm 11 is slidable in the X-direction. Thus, the take-out/take-in arm 11 makes access to the slots of arbitrary heights of all the carriers C placed on the mount 6, and makes access to 2 wafer transfer units 16, 17, an upper and a lower wafer transfer units disposed in the processing unit 2 so as to carry wafers W from the in/out port 4 to the processing unit 2 and oppositely from the processing unit 2 to the in/out port 4.

The processing unit 2 comprises a main wafer carrier apparatus 18, the wafer transfer units 16, 17, four substrate processing units 12, 13, 14, 15 according to the present embodiment, and a heating/cooling unit 19 including 3 heating units for heating process wafer W and a cooling unit for cooling the heated wafers W. The main wafer carrier apparatus 18 is arranged so as to make access to all of the wafer transfer units 16, 17, the substrate processing units 12, 13, 14, 15 and the heating/cooling unit 19.

The processing unit 2 includes an electrifying unit 23 which is an electric power source for operating all the processing system, a mechanical control unit 24 for making the operational control of the various units disposed in the processing system 1 and the processing system 1 as a whole, a chemical liquid storage unit 25 for storing prescribed cleaning liquid to be fed to the substrate processing units 12, 13, 14, 15. The electrifying unit 23 is connected to a main electric power source not shown. A fan filter unit (FFU) 26 for causing downflows of clean air to the respective units and the main wafer carrier apparatus 18 on the ceiling of the processing unit 2.

The electrifying unit 23, the chemical liquid storage unit 25 and the mechanical control unit 24 are disposed on an outer side in the processing unit 2 or capably of being drawn outside from the processing unit 2 so as to facilitate maintaining in this plane (Y-direction) the wafer transfer unit 16, the main wafer carrier apparatus 18 and the heating/cooling unit 19.

The wafer transfer units 16, 17 temporarily receive a wafer W for the transfer of the wafer to/from the wafer carriage unit 5 and are stacked vertically in two stages. For example, the lower wafer transfer unit 17 can be used to receive a wafer W to be transferred from the in/out port 4 to the processing unit 2, and the upper wafer transfer unit 16 can be used to receive a wafer W to be transferred from the processing unit 2 to the in/our port 4.

A part of a downflow from the fan filter unit (FFU) 26 is arranged to flow to the wafer carriage unit 5 through the space between the wafer transfer units 16, 17 and the part above the wafer transfer units 16, 17. Thus, the intrusion of particles, etc. from the wafer carriage unit 5 into the processing unit 2 can be prevented, whereby cleanliness of the processing unit 2 can be retained.

The main wafer carrier apparatus 18 comprises a cylindrical support 30 which can be rotated by the rotary drive force of a motor not shown, and a wafer carrier body 31 which is movable up and down in the Z-direction along the inside of the cylindrical support 30. The wafer carrier body 31 is rotated integrally with the cylindrical support 30 by the rotation of the cylindrical support 30 and has 3 carrier arms 34, 35, 36 which can be advanced or withdrawn independently of each other and are arranged in multi-stages.

In the heating/cooling unit 19, one cooling unit for forcedly cooling wafers W is disposed, and three heating units for forcedly heating and naturally cooling wafers W are stacked on the cooling unit. The heating/cooling unit 19 may be disposed in an upper space in the wafer transfer unit 16, and in this case, the space occupied by the heating/cooling unit 19 in FIG. 1 may be utilized as another utility space.

As shown in FIG. 2, the substrate processing units 12, 13, 14, 15 are arranged in 2 stages each containing 2 substrate processing units. The substrate processing units 12, 13 and the substrate processing units 14, 15 are symmetrical in the structure with respect to the wall 41 between the substrate processing units 12, 13 and the substrate processing units 14. 15, but the substrate processing units 12, 13, 14, 15 are substantially the same in the structure except that they are symmetrical in the structure. Then, the structure of the substrate processing units 12, 13, 14, 15 will be detailed by means of the substrate processing unit 12.

Figure 3:
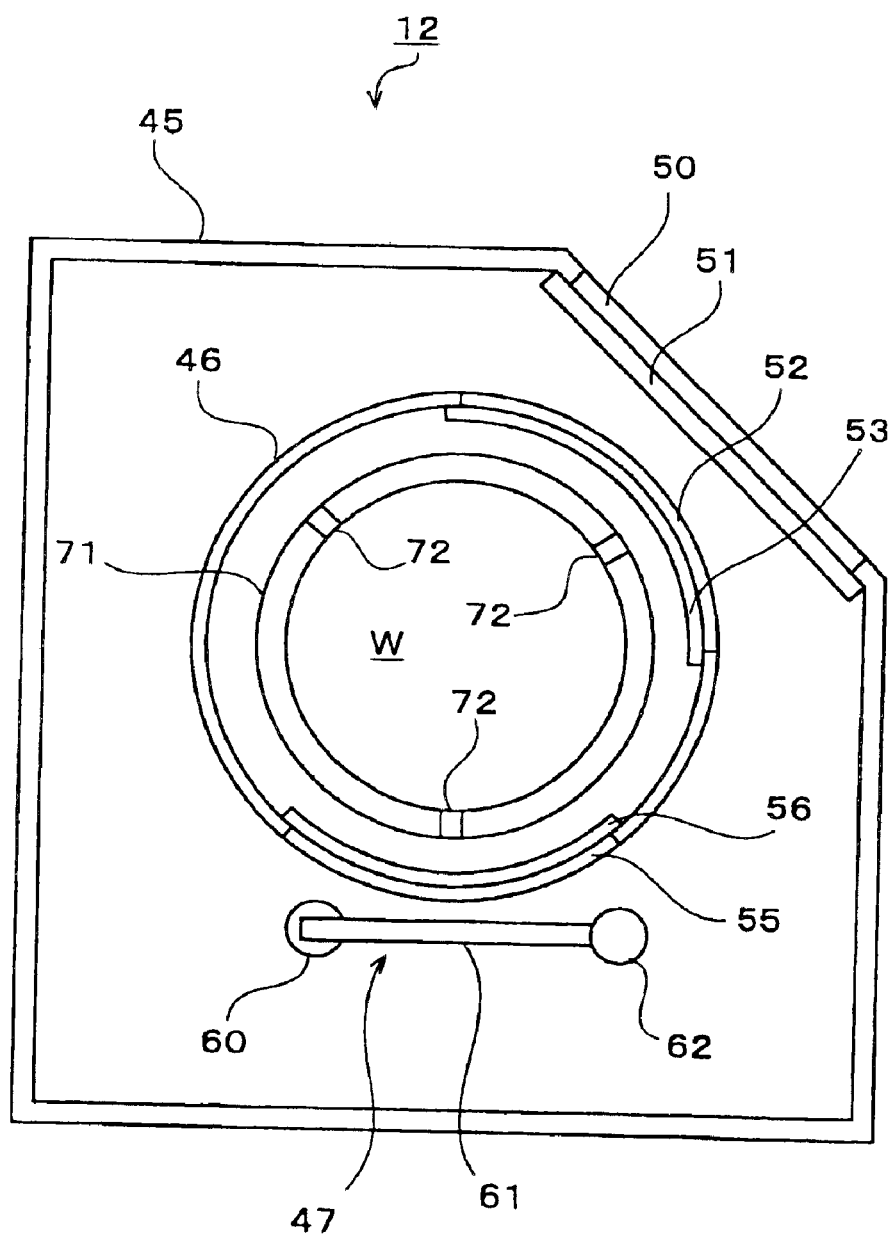
FIG. 3 is a plan view of a substrate processing unit according to a embodiment of the present invention.

FIG. 3 is a plan view of the substrate processing unit 12. In the unit chamber 45 of the substrate processing unit 12, there are disposed an outer chamber 46 which is a substrate processing portion for processing wafers W with processing liquids, and a processing liquid supply means 47 for supplying the processing liquids, etc. to the wafers W in the outer chamber 46. An opening 50 is formed in the unit chamber 45. A unit chamber mechanical shutter 51 which opens/closes the opening 50 by an opening/closing mechanism not shown is provided, so that when wafers W are loaded into the substrate processing unit 12 through the opening 50, the unit chamber mechanical shutter 52 is opened. The unit chamber mechanical shutter 51 opens the opening 50 on the inside of the unit chamber 45, so that even when the unit chamber 45 has a positive internal pressure, an atmosphere inside the unit chamber 45 does not leak outside.

The outer chamber 46 contains wafers W in a close-tight state. An opening 52 is formed in the outer chamber 46. An outer chamber mechanical shutter 53 for opening/closing the opening 52 by a cylinder drive mechanism not shown is provided; for example, when wafers W are loaded into the outer chamber 46 by the carrier arms 34, the outer chamber mechanical shutter 53 is opened. The outer chamber mechanical shutter 52 may be opened by an opening/closing mechanism which is commonly used by the unit chamber mechanical shutter 51. An opening 55 is formed in the outer chamber 46, and a processing liquid supply means shutter 56 which is opened/closed by a drive mechanism not shown is provided. When an atmosphere in the outer chamber 46 is isolated from the processing liquid supply means 47, the processing liquid supply means shutter 56 is closed.

The outer chamber mechanical shutter 53 opens/closes the opening 55 on the inside of the outer chamber 46, so that even when the outer chamber 46 has a positive internal pressure, an atmosphere inside the outer chamber 46 does not leak outside. The processing liquid supply means shutter 56 opens/closes the opening 55 on the inside of the outer chamber 46, so that even when the outer chamber 46 has a positive internal pressure, an atmosphere inside the outer chamber 46 does not leak outside. In this case, the atmosphere around wafers W inside the outer chamber 46 is isolated from the outside of the outer chamber 46, whereby the influence of an atmosphere outside the outer chamber 46 is depressed. Thus, for example, temperatures of the processing liquids and wafers W can be kept desirable.

The processing liquid supply means 47 for supplying to the surfaces of wafers W processing liquids, such as chemical liquids for dissolving resist films applied to the surfaces of the wafers W, rinse liquid, etc. comprises a processing liquid supply nozzle 60, an arm 61 supporting the processing liquid supply nozzle 60, and rotating means 62 for rotatably supporting one end of the arm 61. Thus, the processing liquid supply nozzle 60 is supported by the arm 61 rotatably between a standby position outside the outer chamber 46 and a supply position where the processing liquid supply nozzle 60 supplies processing liquids above wafers W, and can scan the wafers W held in the outer chamber 46 by a pin chuck 71 which will be explained later at least from the centers of the wafers W to the circumferential edges thereof.

The spin chuck 71 for rotatably holding a wafer W is provided in the outer chamber 46. A gas supply nozzle not shown for discharging an inert gas having the temperature adjusted to the surroundings of the wafers W is disposed at an upper part of the outer chamber 46. Support pins not shown for supporting wafers W at circumferential parts of the back surfaces, and retaining members 72 for retaining the wafers W at the circumferential parts are provided on the upper part of the spin chuck 71 at a plurality of positions. In the present embodiment as shown, three retaining members 72 retain wafers W at the circumferential parts thereof.

Figure 4:
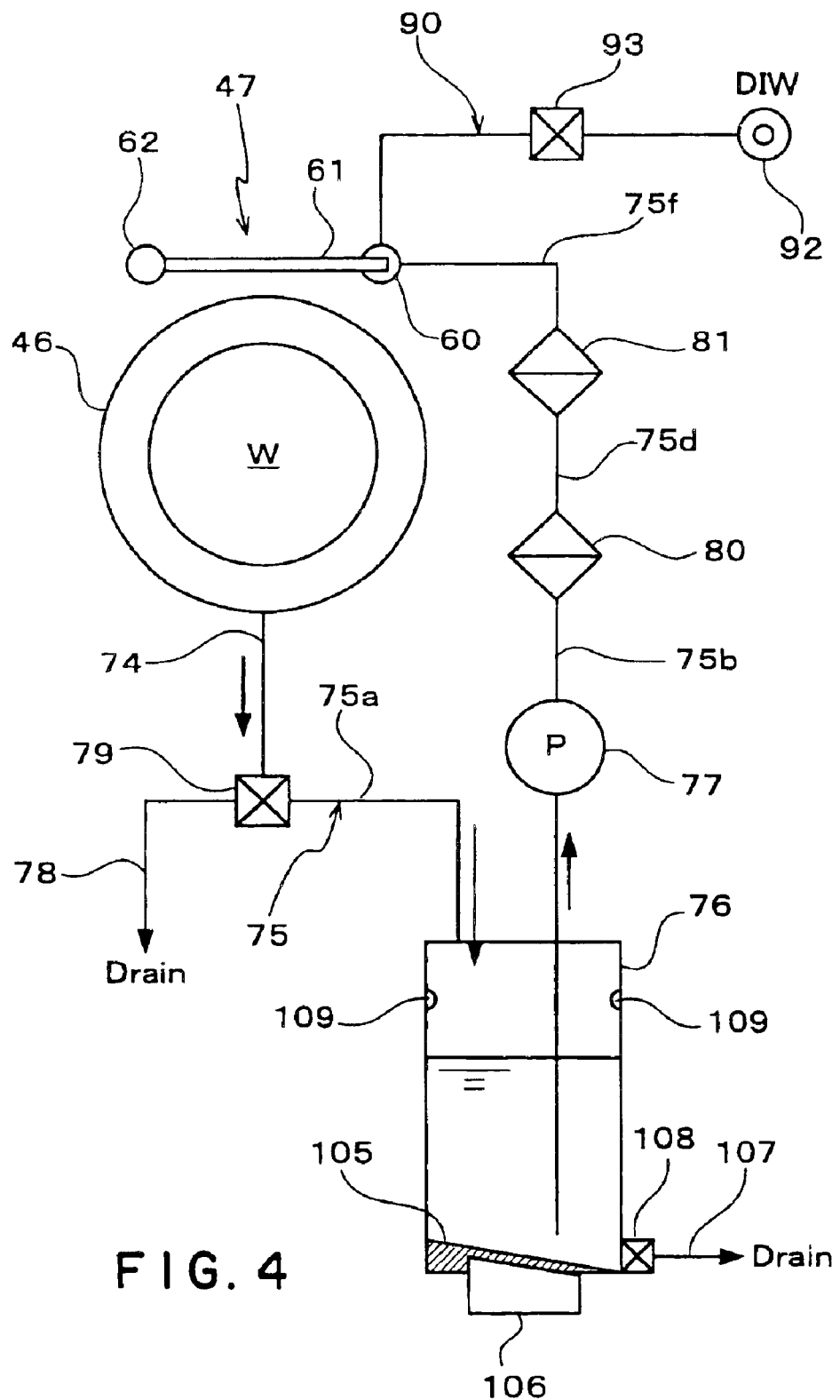
FIG. 4 is a circuit diagram of the circulation of a chemical liquid.

FIG. 4 shows a circuit for a chemical liquid, which is one kind of processing liquids, and a rinse liquid to pass through in the substrate processing unit 12. The substrate processing unit 12 has a chemical liquid recovery passage 75 for the chemical liquid discharged from the outer chamber 46. The chemical liquid recovery passage 75 has the upstream end connected to a processing liquid discharge pipe 74 for discharging the chemical liquid and the rinse liquid in the outer chamber 46 therefrom and has the downstream end connected to the processing liquid supply nozzle 60. Rinse liquid supply means 90 for supplying pure water as the rinse liquid is connected to the processing liquid supply nozzle 60. The rinse liquid supply means 90 has a rinse liquid supply source 92. An on-off valve 93 for passing the pure water during the rinse processing is inserted in the rinse liquid supply means 90. The substrate processing unit 12 has a rinse liquid drain passage 78 for draining the rinse liquid from the outer chamber 46. The rinse liquid drain passage 78 has the upstream end connected to the processing liquid discharge pipe 74.

The chemical liquid recovery passage 75 and the rinse liquid drain passage 78 can be connected to the processing liquid discharge pipe 74 by changing over a valve 79. During the chemical liquid processing, the processing liquid discharge pipe 74 is in connection with the chemical liquid recovery passage to pass the chemical liquid through the processing liquid discharge pipe 74 to the chemical liquid recovery passage 75. During the rinse processing, the processing liquid drain pipe 74 is in connection with the rinse liquid drain passage 78 to pass the rinse liquid through the processing liquid discharge pipe 74 to the rinse liquid drain passage 78 to be drained. That is, the valve 79 is changed over to thereby prohibit the rinse liquid from flowing into the chemical liquid recovery passage 75, and the rinse liquid is prevented from flowing into a chemical liquid tank 76 which will be described later.

In the chemical liquid recovery passage 75 are inserted the chemical liquid tank 76 for storing the chemical liquid recovered from the outer chamber 46, a liquid delivery pump 77 for delivering the chemical liquid flowing through the chemical recovery passage 75, a filter 80 for removing foreign objects mixed in the chemical liquid flowing through the chemical liquid recovery passage 75, and a purifying filter 81 (an additional filter) which is a filter member finer than the filter 80. The chemical liquid tank 76, the liquid delivery pump 77, the filter 80 and the purifying filter 81 are arranged in the stated order from the upstream to the down stream. The finer purifying filter 81 which can provide cleanliness required for the chemical liquid to be reused is disposed downstream of the coarse filter 80, whereby the replacement frequency of the purifying filter 81 can be decreased to about ⅓ of the replacement frequency thereof for the case where the coarse filter 80 is not disposed.

In the present invention, the filter 80 can be made of a fine filter member so as to function as the purifying filter 81. In this case, the filter 80 alone is inserted in the chemical liquid recovery passage 75.

The chemical liquid recovered from the outer chamber 46 by the chemical liquid recovery passage 75 is stored in the chemical liquid tank 76, then sucked by the liquid delivery pump 77 and is passed through the filter 80 and the purifying filter 81, whereby foreign objects mixed in the chemical liquid are recovered by the filter 80 and the purifying filter 81, and the chemical liquid is purified. The purified chemical liquid is again fed to wafers W from the processing liquid supply nozzle 60.

Figure 5:
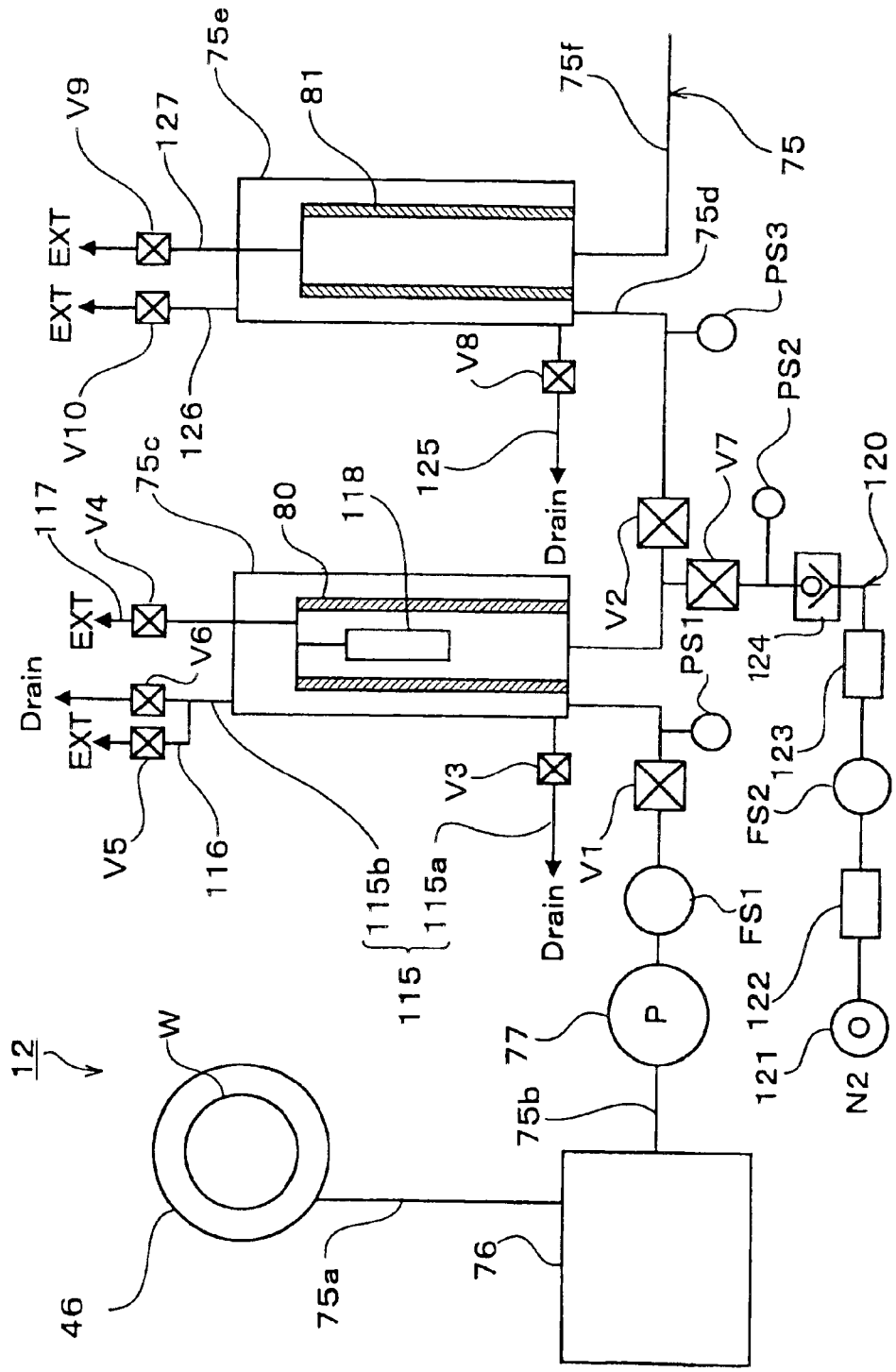
FIG. 5 is a view explaining a chemical liquid recovery circuit, filters, housings, an $N_2$ gas supply passage and filter discharge passages.

As shown in FIG. 5, the chemical liquid recovery passage 75 comprises a chemical liquid passage 75a interconnecting the processing liquid discharge pipe 74 of the outer chamber 46 and the chemical liquid tank 76, a chemical liquid passage 75b for delivering the chemical liquid from the chemical liquid tank 76, a housing 75c enclosing the filter 80, a chemical liquid passage 75d for delivering the chemical liquid from the filter 80, a housing 75e enclosing the filter 81, a chemical liquid passage 75f for delivering the chemical liquid from the purifying filter 81. The chemical liquid passage 75a, the chemical liquid passage 75b the housing 75c, the chemical liquid passage 75d, the housing 75e and the chemical liquid passage 75f are arranged from the upstream to the down stream in the stated order. That is, the chemical liquid passage 75b interconnects the chemical liquid tank 76 and the housing 75c enclosing the filter 80. The housing 75c interconnects the chemical liquid passage 75b and the chemical liquid passage 75d. The chemical liquid passage 75d interconnects the housing 75c and the housing 75d. The housing 75e interconnects the chemical liquid passage 75d and the chemical liquid passage 75f. The chemical liquid passage 75f interconnects the housing 75e and the processing liquid supply nozzle 60.

The bottom surface 105 of the chemical liquid tank 76 inserted between the chemical liquid passage 75a ad the chemical liquid passage 75b is inclined. A supersonic vibrator 106 for applying supersonic vibrations to the bottom surface 105 is disposed on the backside of the bottom surface 105. A drain pipe 107 for draining the chemical liquid is disposed. The drain pipe 107 is disposed at the lower position of the inclined bottom surface 105 and is connected to a side surface of the chemical liquid tank 76 through a valve 108. Thus, all the chemical liquid can be drained without any residue from the chemical liquid tank 76 through the drain pipe 107. Spray nozzles 109 for cleaning the inside of the chemical tank 76 are on the wall of the chemical liquid tank 76. The supersonic vibrator 106 applies supersonic vibrations to the bottom surface 105 when foreign objects has precipitated and settled on the bottom surface 105 incapably of being released, so as to facilitate the release. The spray nozzles 109 spray pure water as a tank interior cleaning liquid and sprays vapor of IPA (isopropyl alcohol) as a tank interior drying fluid. Thus, the interior of the chemical tank 76 is cleaned and dried. The pure water fed into the chemical liquid tank 76 can be drained through the drain pipe 107. When the interior of the chemical tank 76 is cleaned, first the chemical liquid stored in the chemical tank 76 is discharged through the drain pipe 107, and then pure water is fed from the spray nozzles 109 to clean the interior of the chemical liquid tank 76, and finally IPA is fed to dry the interior of the chemical liquid tank 76.

In the chemical liquid passage 75b are inserted the above-described liquid delivery pump 77, an opening/closing valve V1, a pressure sensor PS1 for metering a pressure of the chemical liquid flowing through the chemical liquid passage 75b, and a flow sensor FS1 for metering a flow rate of the chemical liquid. The liquid delivery pump 77, the flow sensor FS1, the opening/closing valve V1 and the pressure sensor PS1 are arranged in the stated order from the upstream. The liquid delivery pump 77 is driven to draw the chemical liquid stored in the chemical liquid tank 76 to supply the chemical liquid from the chemical liquid tank 76 to the processing liquid supply nozzle 60 through the chemical liquid passage 75b, the housing 75c, the chemical liquid passage 75d, the housing 75e and the chemical liquid passage 75f. The liquid delivery pump 77 is upstream of the filter 80 and can delivery the chemical liquid of a prescribed flow rate to the filter 80. The liquid delivery pump 77 is driven in response to control signals supplied from a control unit shown in FIG. 13 and can deliver the chemical liquid having a flow rate in the chemical liquid passage 75b controlled.

Then, the control system of the substrate processing system according to the present embodiment will be explained with reference to FIG. 13.

The control system of the substrate processing system comprises a control unit 200. The control unit 200 includes a main controller 200a and a block controller 200b. The main controller 200a outputs commands for starting to clean the filter 80 and messages for replacing the filter. The block controller 200b executes a sequence of the cleaning the filter 80 and controls the cleaning.

The control system of the substrate processing system comprises a set of sensors 201 including the flow sensor, the pressure sensor, a color sensor, a counter for counting times of cleaning the filter 80, a timer for controlling cleaning the filter 80 in terms of time, etc.

Information from the set of sensors 201 is supplied to the control unit 200 via an input circuit 202, and the control unit 200 outputs control signals. The control signals are supplied to an output circuit 203, and the output circuit 201 controls a solenoid valve manifold box 204, based on the control signals. The solenoid valve manifold box 204 is connected to an air source as a drive force source and drives air driven chemical pumps 206 and air driven valves 207 of the substrate processing system, based on the control signals.

The opening/closing valve V1 shown in FIG. 5 is opened and closed based on control signals supplied from the control unit 200. The pressure sensor PS1 supplies to the control unit 200 metered values as detected signals. A pressure metered by the pressure sensor PS1 depends on a foreign object accumulated state on the filter 80. As foreign objects are accumulated on the filter 80 in increasing amounts, higher pressures are metered by the pressure sensor PS1. The control unit 200 estimates accumulated states of foreign objects trapped by the filter, based on detected signal from the pressure sensor PS1 and can decide the start of the filter cleaning step which will be described later. The control unit 200 can also judge whether or not the step of processing wafers W will be interrupted.

The housing 75c constituting a part of the chemical liquid recovery passage 75 has the above-described filter 80 inside, and a filter discharge passage 115 for discharging the chemical liquid, $N_2$ gas as a cleaning fluid which will be described later and foreign objects from the filter 80 and the surroundings of the filter 80. The housing 75c is a container tight-closely enclosing the filter 80. A lower filter discharge passage 115a is connected to a lower part of the housing 75c. An upper filter discharge passage 115b is connected to the upper surface of the housing 75c. An opening/closing valve V3 is inserted in the lower filter discharge passage 115a for discharging the chemical liquid, $N_2$ gas as a cleaning fluid and foreign objects at the lower part of the housing 75c. An opening/closing valve V6 and an exhaust pipe 116 for discharging gas in the housing 75c are inserted in the upper filter discharge passage 115b for discharging the chemical liquid, the $N_2$ gas and foreign objects at the upper part of the housing 75c. The exhaust pipe 116 and the opening/closing valve V6 are arranged in the stated order from the housing 75c at the upstream. An opening/closing valve V5 which opens/closes in response to control signals supplied from the control unit 200 is inserted in the exhaust pipe 116.

Figure 6:
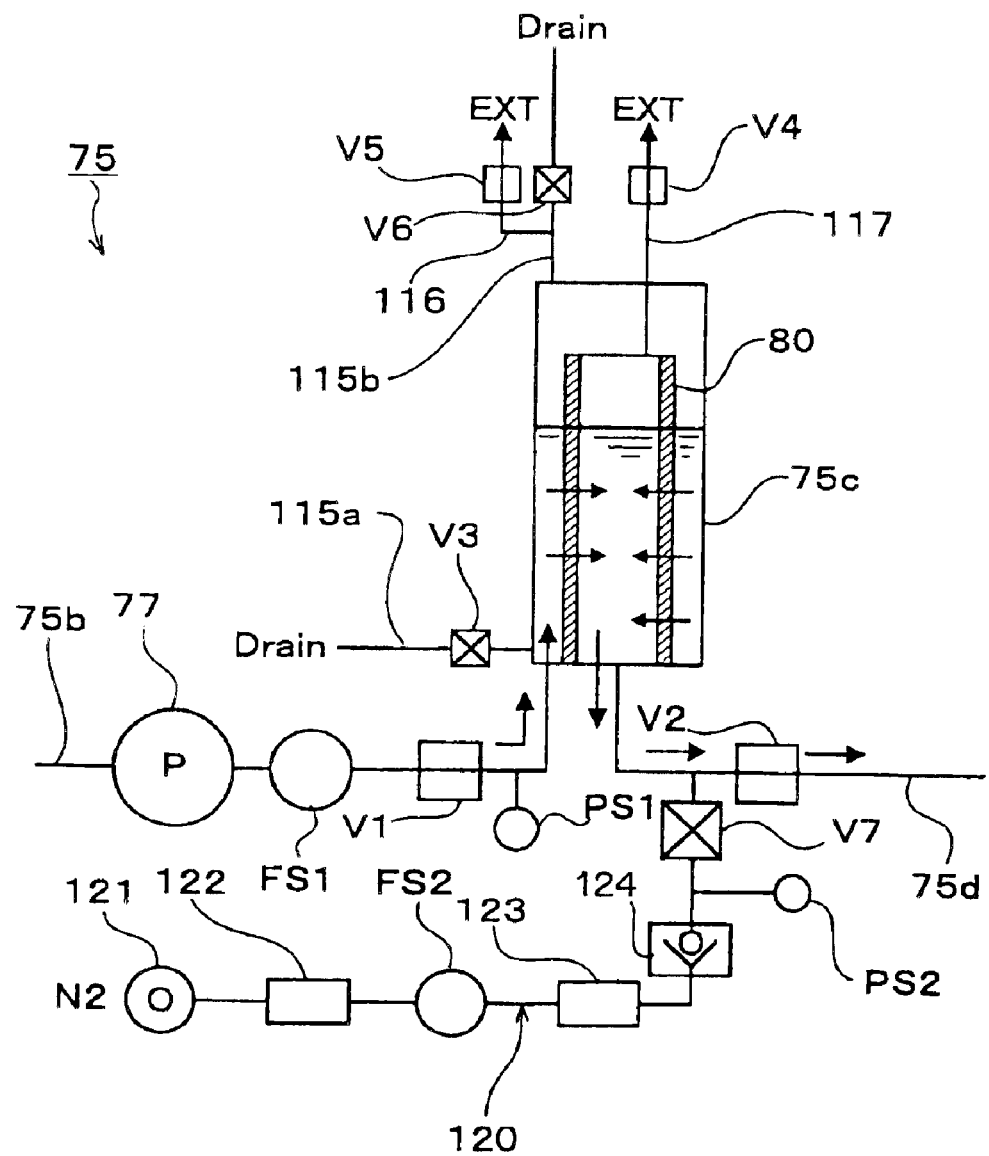
FIG. 6 is a view explaining the steps of removing foreign objects in a chemical liquid by the filter.

The filter 80 is a cylindrical filter member. That is, the outer circumferential surface of the cylinder is the filter member for trapping foreign objects in the chemical liquid, and a cylindrical space is defined inside. The cylindrical inside space has closed end sides. The filter 80 is enclosed by the housing 75c at the outer side, connected to the chemical liquid passage 75d at the bottom of the inside space, connected to the exhaust pipe 117 at the upper side of the inside space, and has the supersonic vibrator 118 which applies supersonic vibrations to a fluid in the inside space. The chemical liquid passage 75b is connected to the housing 75c between the housing 75c and the chemical liquid filter 80 so that the chemical liquid which has not yet passed through the outer circumferential surface of the filter 80 is supplied to the outer circumferential surface of the filter 80. Thus, as shown in FIG. 6, the chemical liquid delivered through the chemical liquid passage 75b passes through the cylindrical outer circumferential surface of the filter 80 to the inside space while foreign objects are removed by the outer circumferential surface, flows into the inside space and flows into the chemical liquid passage 75b at the lower surface of the inside space. An opening/closing valve V4 which opens/closes in response to control signals supplied from the control unit 200 is inserted in the exhaust pipe 117.

In the chemical liquid passage 75d are inserted an $N_2$ gas supply passage 120 for supplying $N_2$ gas as a cleaning fluid for cleaning the filter 80, an opening/closing valve V2 which opens/closes in response to control signals supplied from the control unit 200 and a pressure sensor PS3 for metering a pressure of the chemical liquid flowing through the chemical liquid passage 75d. The $N_2$ gas supply passage 120, the opening/closing valve V2 and the pressure sensor PS3 are arranged in the stated order from the upstream to the downstream.

The $N_2$ gas supply passage 120 is connected to the chemical liquid passage 75d between the inside space of the filter 80 and the opening/closing valve V2, and the chemical liquid passage 75d is connected to the inside space of the filter 80. Thus, when the opening/closing valve V2 of the chemical liquid passage 75d is closed, $N_2$ gas supplied from the $N_2$ gas supply passage 120 passes through the chemical liquid passage 75d, flows into the inside space of the cylindrical filter 80 and passes through the outer circumferential surface from the inside space. Further, the opening/closing valves V6, V3 of the filter discharge passage 115 are opened to discharge the $N_2$ gas from the housing 75c. When $N_2$ gas is continuously supplied through the $N_2$ gas supply passage 120, a flow of the $N_2$ gas is formed from the chemical liquid passage 75d to the filter 80, the surroundings of the filter 80 inside the housing 75c and the filter discharge passage 115. In this case, the $N_2$ gas is supplied in a direction opposite to a direction of passage of the chemical liquid for foreign objects to be removed from through the filter 80, and when the $N_2$ gas passes through the filter 80, the $N_2$ gas releases the foreign objects accumulated on the filter 80 and can carry the released foreign objects out of the housing 75c. The $N_2$ gas pushes also the chemical liquid remaining in the housing 75c out of the housing 75c. That is, the filter discharge passage 115 allows a residue of the chemical liquid and the $N_2$ gas mixed with foreign objects to be discharged from the filter 80 inside the housing 75c and the surroundings of the filter 80. This arrangement carries out the filter cleaning step of releasing and removing foreign objects from the filter 80.

The $N_2$ gas supply passage 120 has an $N_2$ gas supply source 121. In the $N_2$ gas supply passage 120 are inserted a pressure controller 122, a flow sensor FS2 for metering a flow rate of the $N_2$ gas, a check valve 124, a pressure sensor PS2 for metering a pressure of the $N_2$ gas, and an opening/closing valve V7 which opens and closes in response to control signals supplied by the control unit 200. The pressure controller 122, the flow rate sensor FS2, the gas filter 123, the check valve 124, the pressure sensor PS2 and the opening/closing valve V7 are arranged in the stated order from the side of the $N_2$ gas supply source 121. Pressures metered by the pressure sensor PS2 depend on foreign object accumulated states of the filter 80. In the filter cleaning step, as the release of foreign objects on the filter 80 advances, a foreign object accumulated amount decreases, and a pressure loss of the filter 80 decreases to lower pressures to be metered by the pressure sensor PS2. Thus, the control unit 200 estimates released states of foreign objects trapped by the filter, based on detected signals from the pressure sensor PS2, and can judge the completion of the filter cleaning step.

Pressures metered by the pressure sensor PS3 depend on foreign object accumulated states of the purifying filter 81 positioned downstream of the filter 80. As a foreign object accumulated amount of the purifying filter 81 increases, higher pressures are metered by the pressure sensor PS3. Thus, the control unit 200 estimates foreign object accumulated states of foreign objects trapped by the purifying filter 81, based on detected signals from the pressure sensor PS3 and can detect that the purifying filter 81 must be replaced.

The housing 75e forming a part of the chemical liquid recovery passage 75 comprises the above-described purifying filter 81 disposed inside, and a filter discharge passage 125 for discharging the chemical liquid and foreign objects from the surroundings of the purifying filter 81. The housing 75e is a container tight-closely enclosing the purifying filter 81. A filter discharge passage 125 is connected to a lower part of the housing 75e. An opening/closing valve V8 which opens and closes in response to control signals supplied from the control unit 200 is inserted in the filter discharge passage 125. An opening/closing valve V10 which opens/closes in response to control signals supplied from the control unit 200 is inserted in an exhaust pipe 126 provided at the upper surface of the housing 75e.

The purifying filter 81 has the same structure as the filter 80 and is a cylindrical filter member which is finer than the filter 80. That is, the outer circumferential surface of the cylinder is the filter member for trapping foreign objects in the chemical liquid, and a cylindrical space is defined inside. The cylindrical inside space has closed end sides. The purifying filter 81 is enclosed by the housing 75e at the outer side, connected to the chemical liquid passage 75f at the bottom of the inside space, connected to the exhaust pipe 127 at the upper surface of the inside space. The chemical liquid passage 75d is connected to the housing 75e between the housing 75e and the purifying filter 81 so that the chemical liquid which has not yet passed through the outer circumferential surface of the purifying filter 81 is supplied to the outer circumferential surface of the purifying filter 81. Thus, the chemical liquid delivered through the chemical liquid passage 75d passes through the cylindrical outer circumferential surface to the inside space while foreign objects are removed by the outer circumferential surface, flows into the inside space and flows into the chemical liquid passage 75f at the lower surface of the inside space. An opening/closing valve V9 which opens/closes in response to control signals supplied from the control unit 200 is inserted in the exhaust pipe 127.

The constitution of the substrate processing unit 12 is as described above. The rest substrate processing units of the substrate processing system 1 have the same constitution as the substrate processing unit 12, and can process wafers W with the chemical liquid.

Then, the steps of processing wafers W by the substrate processing system 1 according to the present embodiment will be explained.

First, the carriers C each containing, e.g., 25 sheets of wafers W to be processed are mounted on the in/out port 4 of the processing system 1 by a carrier robot not shown. The wafers W are taken out of the carriers C mounted on the in/out port 4 one by one by the take-in/take-out arm 11 to be transferred from the take-out/take-in arm 11 to the main wafer carrier apparatus 18. Then, the wafers W are loaded suitably into the respective substrate processing units 12, 13, 14, 15 by, e.g., the carrier arm 34, and resist films applied to the wafers W are removed. When the prescribed resist film removal processing is completed, the wafers W are taken out of the respective substrate processing units 12 by the main wafer carrier apparatus 18 to be transferred to the take-out/take-in arm 11 and contained again in the carriers C.

Here, the processing will be represented by the processing in the substrate processing unit 12. First, the unit chamber mechanical shutter 52 of the substrate processing unit 12 and the outer chamber mechanical shutter 53 of the outer chamber 46 shown in FIG. 3 are opened. Then, the carrier arm 34 holding a wafer W advances into the processing unit. The main wafer carrier apparatus 18 displaces the carrier arm 34 horizontally to transfer the wafer W to the spin chuck 71. The spin chuck 71 holds the wafer W with holding pins not shown with the front surface for a semiconductor device to be fabricated on faced upward. After the carrier arm 34 has transferred the wafer W to the spin chuck 71, the carrier arm 34 is withdrawn out of the outer chamber 46 and the unit chamber mechanical shutter 51. After the carrier arm 34 has been withdrawn, the unit chamber mechanical shutter 51 of the substrate processing unit 12 and the outer chamber mechanical shutter 53 of the outer chamber 46 are closed.

Next, the spin chuck 71 is rotated, and the retaining members 72 are caused by a centrifugal force to hold the wafers W at the circumferential edges from the outside, whereby the wafers W are rotated. The processing liquid supply means shutter 56 is opened to move the processing liquid supply nozzle 60 to above the wafers W. The liquid delivery pump 77 shown in FIG. 4 is driven in response to a control signal supplied from the control unit 200, and sucks a chemical liquid for removing the resist films, which is stored in the chemical liquid tank 76 to deliver the chemical liquid to the processing liquid supply nozzle 60. The chemical liquid is thus fed to the wafers W, and the processing of removing the resist film of the wafers W is performed. The chemical liquid is supplied near the centers of the wafers W and is caused to flow toward the outer circumferences of the wafers W by a centrifugal force produced by the rotation of the wafers W. The chemical liquid which has flowed toward the outer circumferences of the wafers W is discharged from the outer chamber 46 through the process liquid discharge pipe 74 shown in FIG. 4, passes through the valve 79 and the chemical liquid passage 75a to be stored in the chemical liquid tank 76. Then, the chemical liquid is recirculated in the chemical liquid recovery circuit 75.

Film foreign objects and colloidal foreign objects are mixed in the chemical liquid used for the processing of the wafers W. The used chemical liquid is stored in the chemical liquid tank 76 and is delivered to the filter 80 by the liquid delivery pump 77. The filter 80 traps larger foreign objects to prevent the meshes of the purifying filter 81 from being stuffed. The purifying filter 81 traps smaller foreign objects in the chemical liquid from which larger foreign objects have been removed to thereby filter the chemical liquid to a required cleanliness. The trapped foreign objects are accumulated on the outer circumferential surfaces of the filter 80 and the purifying filter 81. The chemical liquid which has been used in the processing of the wafers W is recovered to be reused in the processing of wafers W. Thus, a consumption amount of the chemical liquid can be made smaller.

After a prescribed period of time, the step of removing the resist films is completed, and then a rinse processing is started. The processing liquid supply nozzle 60 feeds pure water as a rinse liquid to the upper surfaces of the wafers W while scanning at least from the centers of the wafers W to the circumferential edges thereof. The pure water is fed to the wafers W on rotation, whereby the pure water can be uniformly scattered all over the upper surfaces of the wafers W. The chemical liquid is thus rinsed off the wafers W. The pure water used in the processing is discharged from the outer chamber 46 through the processing liquid discharge pipe 74 shown in FIG. 4. The valve 79 has been changed over so that the pure water does not flow into the chemical liquid recovery passage 75, and the pure water passes through the valve 79 to be drained through the rinse liquid drain passage 78.

After the rinse processing, the wafers W are spun at a larger rotation number (e.g., about 150 rpm) than that for the rinse processing to be dried. $N_2$ is fed to the upper surfaces of the wafers W by the processing liquid supply nozzle 60.

After the drying processing, the processing liquid supply nozzle 60 is withdrawn out of the outer chamber 46, and then the wafers W are unloaded from the substrate cleaning unit 12. The unit chamber mechanical shutter 53 and the unit chamber mechanical shutter 51 are opened, and the main wafer carrier apparatus 18 advances the carrier arm 34 into the processing unit to support the back surfaces of the wafers W. Then the carrier arm 34 releases the wafers W from the support pins of the spin chuck 71 to receive the wafers W and is withdrawn from the processing unit.

Then, wafers W which have not been rinsed yet are loaded into the substrate processing unit 12 by, e.g., the carrier arm 35. There, the wafers W are subjected to the processing of removing resist films applied to the wafers, the rinse processing and the drying processing. The wafers W which have been subjected to the prescribed processing are suitably unloaded from the substrate processing unit 12 by again the main wafer carrier apparatus 18. The above-described processing steps are repeated several times in the substrate processing unit 12.

As a number of processed wafers W is increased, accumulated amounts of foreign objects on the filter 80 and the purifying filter 81 go on increasing. As an accumulated amount of foreign objects on the filter 80 increased, higher pressures are metered by the pressure sensor PS1 disposed in the chemical liquid passage 75b. Detected signals of the pressure sensor PS1 are supplied to the control unit 200. When the filter 80 is stuffed or is near stuffing, the step of processing the wafers W is interrupted so as to start the filter cleaning step. In the filter cleaning step, the blow cleaning step of blowing $N_2$ gas to release foreign objects on the filter 80 to discharge the foreign objects, and the lower discharge step of discharging foreign objects settling at on the bottom of the housing 75c following the former step are performed. When the control unit 200 judges based on detected signals from the pressure sensor PS1 that the filter 80 must be cleaned, the control unit 200 interrupts the step of processing the wafers W in the substrate processing unit 12 so as to start the blow cleaning step of releasing foreign objects on the filter 80. When the control unit 200 judges that the foreign objects on the filter 80 have been sufficiently released, the control unit 200 terminates the blow cleaning step and starts the lower discharge step.

As an accumulated amount of foreign objects on the purifying filter 81 is increased, higher pressure are metered by the pressure sensor PS3 disposed in the chemical liquid passage 75d. Detected signals of the pressure sensor PS 3 are supplied to the control unit 200. When the control unit 200 judges based on the detected signals that the purifying filter 81 must be cleaned, i.e., the purifying filter 81 has been stuffed or is near stuffing, the control unit 200 interrupts the step of processing the wafers W so as to replace the purifying filter 81 with a fresh one.

The filter cleaning step of cleaning the filter 80 will be explained below. In this step, the opening/closing valves V1, V2, V3, V4, V5, V6, V7 are changed over in response to control signals from the control unit 200 to release foreign objects with $N_2$ gas to discharge the foreign objects. While a chemical liquid is passing through the chemical recovery passage 75, as shown in FIG. 6, the opening/closing valves V1, V2 are opened, and the opening/closing valve V5 is opened to discharge gas staying in an upper part of the housing 75c. The opening/closing valve V4 of the exhaust pipe 117 is opened to discharge gas staying in an upper part of the filter 80. On the other hand, the opening/closing valves V3, V6, V7 are closed.

FIG. 7 is an explanatory view of the blow cleaning step of blowing $N_2$ gas to release foreign objects on the filter and discharging the foreign objects. First, the liquid delivery pump 77 is stopped in response to a control signal from the control unit 200. Then, the opening/closing valves V1, V2, the opening/closing valve V5 of the exhaust pipe 116, and the opening/closing valve V4 of the exhaust pipe 117 are closed. Next, the opening/closing valve V6 of the upper filter discharge passage 115b and the opening/closing valve V7 of the $N_2$ gas supply passage 120 are opened. Then, $N_2$ gas is supplied from the $N_2$ gas supply source 121. The $N_2$ gas flows from the $N_2$ gas supply source 120 into the internal space of the filter 80 through the chemical liquid passage 75b to pass through the filter 80. When the $N_2$ gas passes through the filter 80, the $N_2$ gas releases foreign objects accumulated on the filter 80. In the blow cleaning step, $N_2$ gas is forcefully fed to blow foreign objects. $N_2$ gas is blown to effectively release foreign objects, pushing out the foreign objects and the chemical liquid remaining in the housing 75c. Furthermore, in order to release foreign objects more effectively, the supersonic vibrator 118 is operated to apply supersonic vibrations to the chemical liquid remaining inside the filter 80, and the $N_2$ gas. The $N_2$ gas flows in the housing 75c toward the upper filter discharge passage 115b to be discharged through the upper filter discharge passage 115b. Released foreign objects and the remaining chemical liquid are discharged together with the $N_2$ gas through the upper filter discharge passage 115b.

In the blow cleaning step, as the release of foreign objects on the filter 80 advances, and a foreign object accumulated amount is decreased, a pressure loss of the filter becomes smaller, and a pressure of the $N_2$ gas flowing through the $N_2$ gas supply passage 120 lowers. That is, pressures metered by the pressure sensor PS2 disposed in the $N_2$ gas supply passage 120 become lower. The control unit 200 estimates released states of foreign objects on the filter, based on detected signals from the pressure sensor PS2. The control unit 200 sets on the blow cleaning step until the control unit 200 judges that the foreign objects have been sufficiently released.

Figure 8:
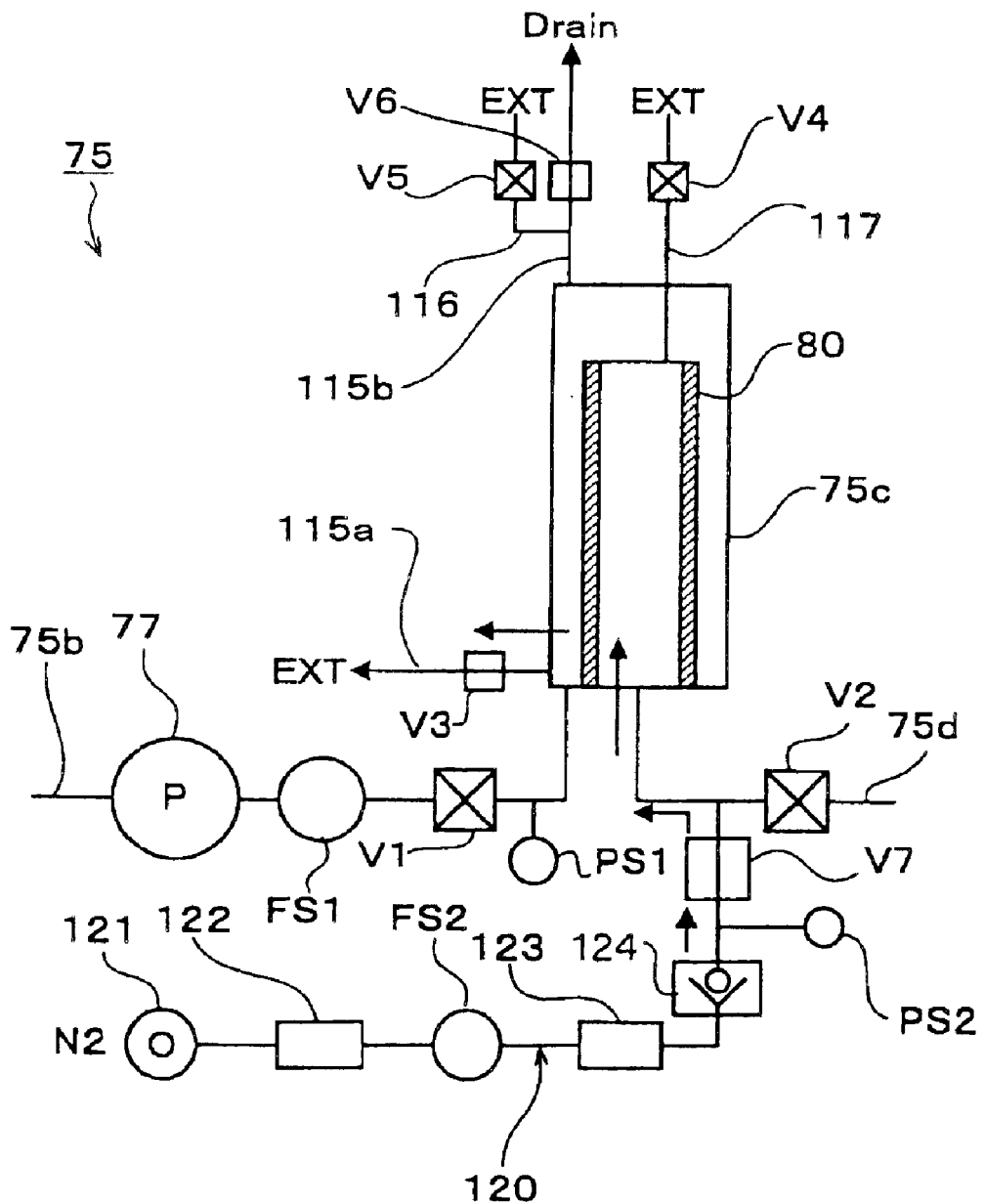
FIG. 8 is a view explaining the steps of discharging foreign objects at a lower part of the housing.

When foreign objects on the filter 80 have been sufficiently released, a pressure of the $N_2$ gas which has not yet passed through the filter 80 lowers. When the control unit 200 judges based on detected signals from the pressure sensor PS2 that the foreign objects have been sufficiently released, the control unit 100 decreases a flow rate of N2 gas to be supplied through the $N_2$ gas supply passage 120 to stop the release of the foreign objects on the filter 80. Thus, the blow cleaning step is completed. Then, the control unit 200 supplies control signals to the $N_2$ gas supply passage 120 and the opening/closing valve V3 of the lower filter discharge passage 115a to start the lower discharge step. FIG. 8 is an explanatory view of the lower discharge step of discharging foreign objects settled on the bottom of the housing 75c. As in the blow cleaning step, the opening/closing valve V2, the opening/closing valve V5 of the exhaust pipe 116 and the opening/closing valve V4 of the exhaust pipe 117 are closed, and the opening/closing valve V6 of the upper filter discharge passage 115b, the opening/closing valve V7 of the $N_2$ gas supply passage 120 are opened. $N_2$ gas is continuously supplied at the decreased flow rate which was decreased at the time of completion of the blow cleaning step.

First, the opening/closing valve V3 of the lower filter discharge passage 115a is opened. The $N_2$ gas supplied through the $N_2$ gas supply passage 120 flows into the inside space of the filter 80 through the chemical liquid passage 75d and passes through the filter 80. When the $N_2$ gas passes through the filter 80, the $N_2$ gas releases foreign objects accumulated on the filter 80. The $N_2$ gas is discharged through the upper filter discharge passage 115b disposed on the upper surface of the housing 75c and through lower filter discharge passage 115a disposed at the lower part of the housing 75c. Foreign objects and chemical liquid settling at the lower part are discharged together with $N_2$ gas through the lower filter discharge passage 115a disposed at the lower part of the housing 75c.

With the opening/closing valve V1 of the chemical recovery passage 75b opened, the liquid delivery pump 77 is driven to flow a small amount of the chemical liquid to a lower part of the housing 75c. The liquid delivery pump 77 is controlled to operate at a speed lower than a speed for the ordinary chemical liquid delivery. The chemical liquid which has been fed to a lower part of the housing 75c is discharged through the lower filter discharge passage 115a, whereby foreign objects settling at the lower part can be discharged together with the chemical liquid through the lower filter discharge passage 115a. In this case, the chemical liquid is flowed in a small amount which can discharge foreign objects.

Then, in response to control signals from the control unit 200, the opening/closing valve V7 is closed to stop the $N_2$ gas supply, and the opening/closing valves V3, V6 are closed to stop the discharge through the filter discharge passage 115. Thus, the lower discharge step is completed. The lower discharge step thus follows the blow cleaning step, whereby foreign objects and the chemical liquid can be effectively discharge. The blow cleaning step and the lower discharge step may be concurrently performed. For example, the opening/closing valves V6, V3 are concurrently opened to blow supply $N_2$ gas from the $N_2$ gas supply passage 120, and concurrently therewith, the liquid delivery pump 77 is driven to supply the chemical liquid at a low flow rate. That is, while foreign objects are being released by blow-supplying $N_2$ gas, the foreign objects are discharged together with the chemical liquid through the lower filter discharge passage 115a. In this case, the filter cleaning step can be completed in a short period of time.

The filter cleaning step including the above-described blow cleaning step of the filter 80 and the lower discharge step is performed, whereby the function of removing foreign objects on the filter 80 can be restored. The opening/closing valves V1, V2 are again opened as shown in FIG. 6 to pass the chemical liquid through the chemical liquid recovery passage 75 to thereby remove foreign objects in the chemical liquid.

The above-described substrate processing unit 12 can restore the function of removing foreign objects on the filter 80 by providing the $N_2$ gas supply passage 120 and the filter discharge passage 115. The filter 80 is disposed upstream of the finer purifying filter 81, whereby larger foreign objects are trapped to make the purifying filter 81 more durable. Accordingly, the purifying function required of the purifying filter 81 can be retained longer, and a replacement frequency of the purifying filter 81 can be decreased.

One preferred embodiment of the present invention has been described above, but the present invention is not limited to the above-described embodiment. The present invention can be suitably modified to be practiced. For example, the substrate processing system is not limited to the single wafer-type and may be of the spin type, the immersion-type or other types. In immersion-type substrate processing systems, the processing unit is in the form of a processing vessel for storing a chemical liquid, and the chemical liquid recovery passage 75 described in the present embodiment is provided. The immersion-type substrate processing system does not require the chemical liquid tank 76 inserted in the chemical liquid recovery passage 75.

Figure 11:
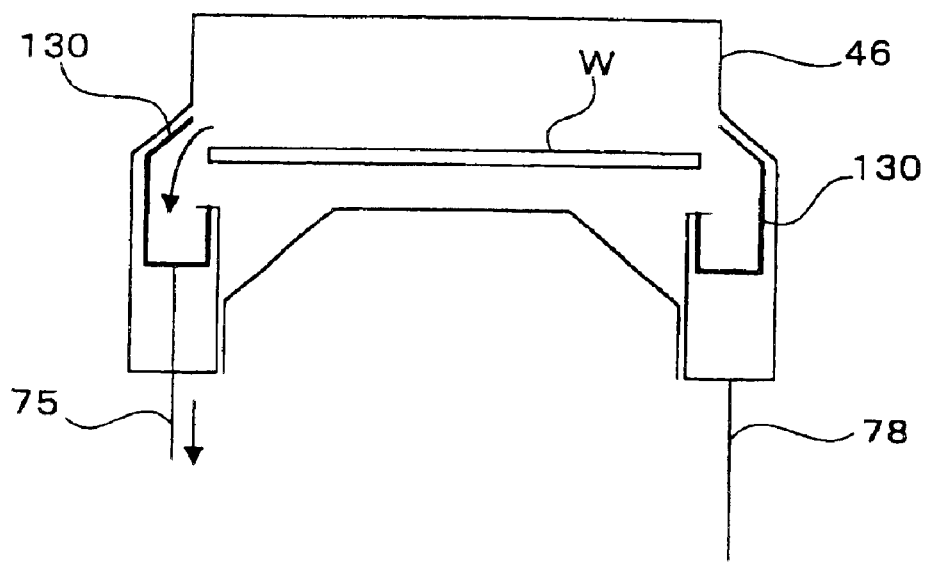
FIG. 11 is a view explaining, in a case where an inner cup is provided, the step of discharging liquid drops in the inner cup to a mist trap.
Figure 12:
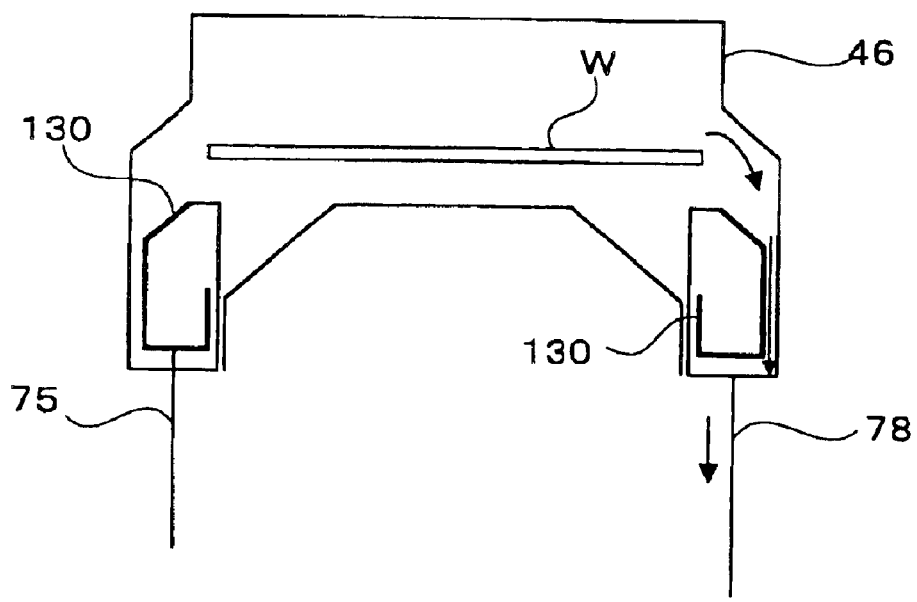
FIG. 12 is a view explaining, in the case where the inner cup is provided, the step of discharging liquid drops in the outer chamber to the mist trap.

In the substrate processing unit 12, the chemical liquid recovery circuit 75 can be connected to the outer chamber 46, where substrates are processed, in various constitutions. For example, as shown in FIG. 11, it is possible that an inner cup 130 which is vertically movable is disposed in the tightly-closed outer chamber 46, the chemical liquid recovery passage 75 is connected to the inner cup 130, and the rinse liquid drain passage 78 is connected to the outer chamber 46. That is, in the chemical liquid processing, as shown in FIG. 11, wafers W are enclosed by the inner cup 130 so as to prevent the chemical liquid from scattering around to discharge the chemical liquid in the inner cup 130. In the rinse processing, as shown in FIG. 12, the inner cup 130 is lowered, and the wafers W are enclosed by the outer chamber 46 so as to prevent the rinse liquid from scattering around to discharge the rinse liquid in the outer chamber 46. When the inner cup 130 is lifted, the inner cup 130 is brought adjacent to the outer chamber 46 so as to prevent the chemical liquid from intruding between the outer chamber 46 and the inner cup 130. When the inner cup 130 is lowered, the rinse liquid does not intrude into the inner cup 130. In this case, the mixing of the rinse liquid into the chemical liquid to be recovered can be prevented, whereby the chemical liquid of high cleanliness can be circulated for the use. It is also possible that the rinse liquid drain passage 78 is connected to the inner cup 130, and the chemical liquid recovery passage 75 is connected to the outer chamber 46 to discharge the rinse liquid in the inner cup 130 and discharge the chemical liquid in the outer chamber 46.

Figure 9:
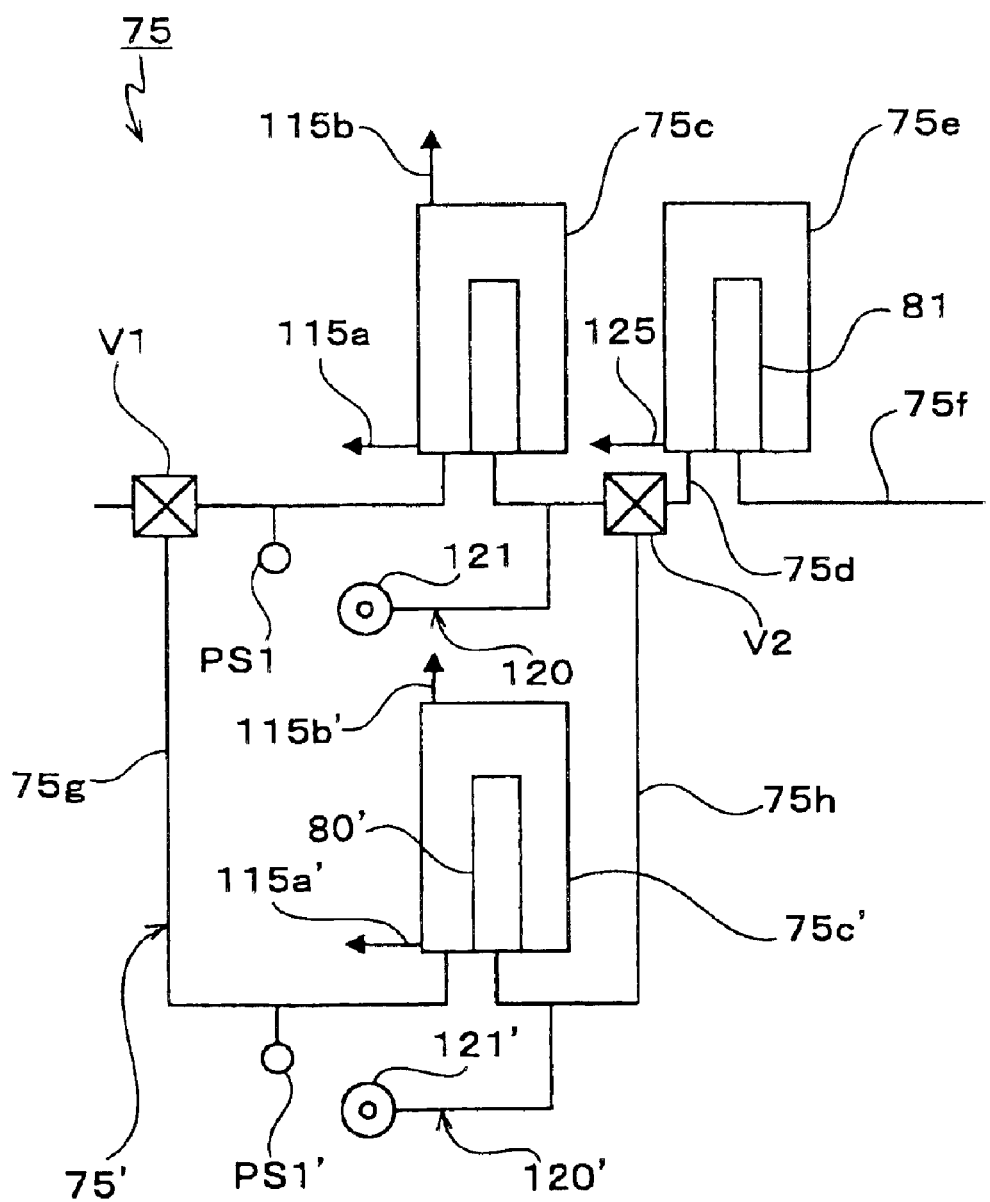
FIG. 9 is a view diagrammatically explaining the arrangement of two filters in parallel at the upstream of the purifying filter.

As a second mode of disposing a coarse filter for removing larger foreign objects upstream of the fine purifying filter 81, the filter 80 and a filter 80' may be branched in parallel at the upstream of the purifying filter 81. As exemplified in FIG. 9, a second chemical liquid passage 75g is connected to the opening/closing valve V1 inserted in the chemical liquid passage 75b, and the opening/closing valve V1 is a change-over opening/closing valve which switches a state where a chemical liquid flows through the chemical liquid passage 75b and a state where the chemical liquid flows through the second chemical liquid passage 75g to each other. A housing 75c' of the same constitution as the housing 75c is connected to the downstream end of the second chemical liquid passage 75g, a filter 80' of the same constitution as the filter 80 is disposed inside the housing 75c', a second chemical liquid passage 75h is connected to the housing 75c', and the downstream end of the second chemical passage 75h is connected to the chemical liquid passage 75d via the opening/closing valve V2. That is, in addition to the chemical liquid recovery passage 75, which comprises the chemical liquid passage 75a, the chemical liquid passage 75b, the housing 75c, the chemical liquid passage 75d, the housing 75e and the chemical liquid passage 75f, a second chemical liquid recovery passage 75' comprising the chemical liquid 75a, the chemical liquid passage 75b, the second chemical liquid passage 75g, the housing 75c', the second chemical liquid passage 75h, the chemical liquid passage 75d, the housing 75e and the chemical liquid passage 75f is provided. The second chemical liquid recovery passage 75 has a pressure sensor PS1' inserted in the second chemical liquid passage 75h, the housing 75c' has a lower filter discharge passage 115a' and an upper filter discharge passage 115b', the second chemical liquid passage 75h has an $N_2$ gas supply passage 120' of the same constitution as the $N_2$ gas supply passage 120. That is, the second chemical liquid recovery passage 75' can purifies a chemical liquid, as does the chemical liquid recovery passage 75, and the filter 80' is cleaned by feeding $N_2$ gas, as is the filter 80.

When the filtration of the filter 80 lowers with increased amounts of foreign objects, the opening/closing valve V1 is changed over to pass a chemical liquid to the filter 80' to remove foreign objects in the chemical liquid. The chemical liquid the foreign objects have been removed from is flowed, by the change-over to the opening/closing valve V2, to the purifying filter 81 through the chemical liquid passage 75d. While foreign objects are being removed by the filter 80', the filter 80 is subjected tot he filter cleaning step. In this case, even when foreign objects are accumulated on the filter 80 of the chemical liquid recovery passage 75, the valve can be changed over so as to flow the chemical liquid through the filter 80' disposed in the second chemical liquid recovery passage 75', whereby the liquid delivery to the processing liquid supply nozzle 60 can be continued. While the liquid delivery is set on, the filter 80 with foreign objects accumulated on can be cleaned. Similarly, when the filtration of the filter 80' lowers as foreign objects accumulate on the filter 80' in increasing amounts, foreign objects in the chemical liquid are removed by the filter 80 so as to clean the filter 80'. Thus, foreign object removal from a chemical liquid and cleaning of one filter can be performed in parallel.

As a third mode of disposing a filter for removing larger foreign objects at the upstream of the fine purifying filter 81, as exemplified in FIG. 10, it is possible that a purifying filter 81' of the same constitution as the purifying filter 81 is branched in parallel with the purifying filter 81, and a filter 80' is disposed at the upstream of the purifying filter 81'. The filter 80' has the same constitution as the filter 80, and the purifying filter 81' has the constitution for realizing cleanliness required of a chemical liquid to be reused, as has the purifying filter 81. The second chemical liquid recovery passage 75' comprises the filter 80', the above-described $N_2$ gas supply passage 120' and the purifying filter 81'. The housing 75c' enclosing the filter 80' has a lower filter discharge passage 115a' and an upper filter discharge passage 115b'. The second chemical liquid passage 75h has an $N_2$ gas supply passage 120' of the same constitution as the $N_2$ gas supply passage 120. The purifying filter 81' is enclosed by a housing 75e' of the same constitution as the housing 75e. That is, the second chemical liquid recovery passage 75' can purify a chemical liquid, as does the chemical liquid recovery passage 75. The filter 80' is cleaned by feeding $N_2$ gas, as is the filter 80. In this case as well, when the filtration of the filter 80' lowers as foreign objects are accumulated in increased amounts, the valves are changed over so as to remove foreign objects in the chemical liquid by the filter 80 so as to clean the filter 80', whereby the foreign object removal from a chemical liquid and the cleaning of one filter can be performed in parallel.

In the present embodiment, foreign object accumulated states of the filter 80 are estimated by the pressure sensor PS1, and cleaned states of the filter 80 are estimated by the pressure sensor PS2. However, it is possible to estimate foreign object accumulated states and cleaned states by metering flow rates by the flow sensors FS1, FS2. For example, values metered by the flow sensors FS1, FS2 are supplied to the control unit 200 as detected signals. While foreign objects in a chemical liquid are being removed, as foreign object accumulated amounts of the filter 80 increase, flow rates of the chemical liquid metered by the flow sensor FS1 decrease. Accordingly, the control unit estimates accumulated states of foreign objects trapped by the filter 80, based on detected signal of the flow sensor FS1 and can judge start of the release of the foreign objects on the filter 80. In the filter cleaning step, as foreign object accumulated amounts of the filter 80 decrease, flow rates of $N_2$ gas metered by the flow sensor FS2 increase. Accordingly, the control unit 200 estimates released states of foreign objects on the filter 80, based on flow rates metered by the flow sensor FS2 and can decide the end of the release of foreign objects on the filter 80.

In the present embodiment, the $N_2$ gas supply passage 120 is connected to the chemical liquid passage 75d on the way to the inside space of the filter 80 but may be connected directly to the inside space to supply $N_2$ gas directly there. In this case as well, flows of $N_2$ gas are formed from the $N_2$ gas supply passage 120 to the filter 80, the surroundings of the filter 80 in the housing 75c and the filter discharge passage 115, whereby the filter cleaning step of releasing foreign objects on the filter 80 to remove the foreign objects can be performed.

A cleaning fluid for cleaning the filter 80 can be provided by the same chemical liquid that passes through the filter 80, which is other than $N_2$ gas. As a cleaning fluid for cleaning the filter 80, pure water or an organic solvent containing isopropyl alcohol (IPA) can be used.

Figure 14:
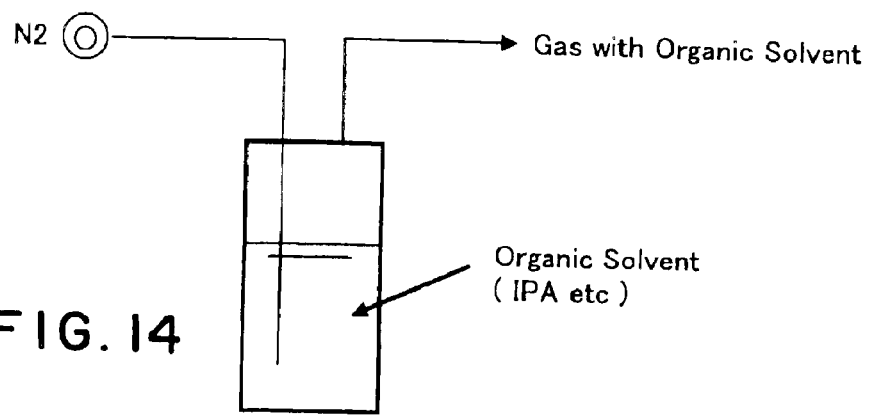
FIG. 14 is a view diagrammatically explaining an apparatus and method for producing as a cleaning fluid a gas containing an organic solvent.

As a cleaning fluid for cleaning the filter 80, it is preferable that a gas containing an organic solvent is used. A method and a device for producing a gas containing an organic solvent is shown in FIG. 14. A shown in FIG. 14, a gas containing $N_2$ gas is injected into an organic solution with a tube or other means, and bubbles of the gas contact the solution of the organic solvent, whereby the organic solvent content gas is produced. The filter 80 is cleaned with the organic solvent-content gas, whereby the organic solvent solves foreign objects, and the gas effectively releases the foreign objects.

It is possible that a cleaning fluid for cleaning the purifying filter 81, and a discharge passage for discharging foreign objects accumulated on the purifying filter 81 therefrom and the cleaning fluid are provided in the chemical liquid passage 75f. For example, a cleaning fluid supply passage having the same constitution as the $N_2$ gas supply passage 120 and supplying $N_2$ gas as a cleaning fluid is connected to the chemical liquid passage 75f, and an opening/closing valve for flowing $N_2$ gas into a cylindrical filter member is inserted downstream thereof, as is the opening/closing valve V2. A discharge passage of the same constitution as the upper filter discharge passage 115b is provided so as to blow feed $N_2$ gas to effectively release foreign objects. In this case, the purifying filter 81 is cleaned so that the purifying filter 81 can restore the foreign object removing function, whereby a frequency of replacing the purifying filter 81 can be decreased. Thus, throughputs of the wafer W processing can be further improved.

To detect accumulated states of foreign objects trapped by the filter 80 it is possible to use a color sensor to detect colors of the filter 80. When foreign objects mixed in a chemical liquid are accumulated on the filter 80 in the step of removing a resist film are recognized as black. The filter 80 which is free from foreign objects is made in a light color, such as white or others, so that the black color of the foreign objects is detected by the color sensor to detect accumulated states of the foreign objects. Based on the detected signals, the control unit 200 can estimate accumulated states of foreign objects and cleaned states of the filter.

Accumulated states of foreign objects may be visually detected. In this case, it is preferable that a transparent window is opened in the housing 75c enclosing the filter 80 so that foreign objects can be visually easily confirmed.

It is also possible that detecting means for detecting processed states of wafers W processed in the substrate processing unit 12 is provided, and based on detected results of the processed states of the wafers W given by the detection means, abnormalities of the filter 80 are detected to estimate accumulated states f foreign objects on the filter 80.

The step of cleaning the filter 80 may be performed by presetting a time interval between the end of the filter cleaning step and the start of the next filter cleaning step. In this mode, a time interval up to the start of the filter cleaning step is metered by the timer shown in FIG. 13, and when a prescribed period of time has passed, signals are supplied to the control unit 200, and the block controller 200b of the control unit 200 outputs signals commanding the start of the cleaning, and the block controller 200b controls the execution of the sequence of the cleaning step. This mode is applicable to continuous processing of a plurality of wafers W at a prescribed time interval.

The cleaning step of cleaning the filter 80 may be performed by presetting times of processing by the substrate processing unit 12, i.e., a number of wafers W to be processed and carrying out the cleaning step every prescribed processing times.

Figure 13:
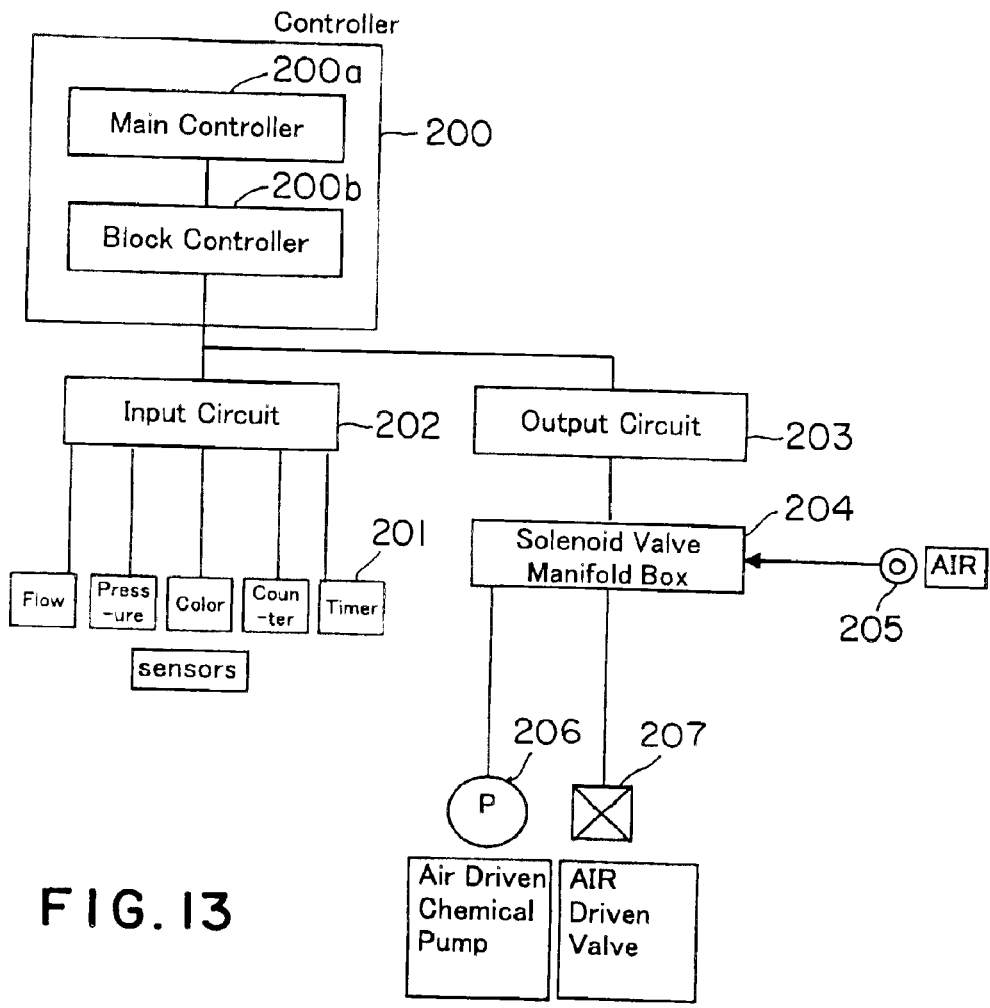
FIG. 13 is a block diagram of a control system.

In this mode, times of cleaning the filter 80 are counted by the counter shown in FIG. 13, signals are supplied to the control unit 200 when prescribed times have been counted, and the main controller 200a of the control unit 200 outputs a message of the replacement of the filter 80. The message can be an announcement, an alarm, an indication or others. Cleaning times may be metered by counting times of the change-over of the valves.

The supersonic vibrator 118 disposed below the filter 80 may apply supersonic vibrations directly to the filter 80. In this case as well, the release of foreign objects accumulated on the filter 80 can be effectively enhanced. The supersonic vibrator 118 may be disposed in the housing 75c. For example, the supersonic vibrator 118 is disposed on the inside wall of the housing 75c. In this case as well, supersonic vibrations can be applied to foreign objects through a fluid in the housing 75c.

In place of the supersonic vibrations, a sonic vibrator of a 10–100 Hz may be provided on the filter 80. The sonic vibrator may be disposed on the filter 80 itself or the housing 75c, or in various manners, as is the supersonic vibrator.

In place of the supersonic vibrator, a heater may be provided on the filter 80. In this case, foreign objects accumulated on the filter 80 are softened by the heat of the heater and can be easily removed by a cleaning fluid.

The filter 80 of the present invention is formed of a cylindrical filter member, and the filter member can be formed in a replaceable cartridge. That is, the housing enclosing the filter 80 is detachable formed, and the replaceable cartridge-type filter 80 can be placed inside the housing. The filter 80 is thus formed in a cartridge, whereby the filter 80 can be very easily replaced.

Furthermore, the purifying filter 81 of the present invention may be disposed in the filter 80.

In this case, the filter 80 and the purifying filter 81 are formed both in cylindrical filter members, and the purifying filter 81 is disposed in the filter 80. Processing liquids pass through outer circumferential surface of the cylindrical filter member of the filter 80 to the inside and subsequently pass through the outer circumferential surface of the cylindrical member of the purifying filter 81 to the inside. On the other hand, a cleaning fluid flows into the space between the filter 80 and the purifying filter 81 and passes through the outer circumferential surface of the cylindrical filter member from the inside. This mode and constitution can make the purifying filter 81 longer durable although the constitution is compact.

The substrate processing system according to the present invention is not limited to supplying a chemical liquid to the resist film removing processing and can subject substrates to processing other than the resist film removing processing. For example, the substrate processing system can perform polymer removing processing. Substrates are not limited to semiconductor wafers and can be CD substrates for LCD substrates, CD substrate, print substrates, ceramic substrates, etc.

According to the present invention, when the filters are stuffed, foreign objects accumulated on the filters can be released, and the filters can be cleaned. Accordingly, the foreign object removing function of the filters can be restored. Accordingly, the downstream fine filter can be long durable. The removal of foreign objects in processing liquid and the cleaning of the filters can be performed in parallel.

What is claimed is:

1. A substrate processing system comprising a substrate processing unit for processing a substrate with a processing liquid, and a processing liquid recovery passage for the processing liquid discharged from the substrate processing unit to flow through, the processing liquid recovery passage including a filter for removing foreign objects mixed in the processing liquid; a cleaning fluid supply passage for feeding a cleaning fluid for cleaning the filter; and a discharge passage for discharging the foreign objects and the cleaning fluid from the filter, wherein the filter is a cylindrical filter member, the processing liquid passes through the cylindrical member from the outer circumferential surface to the inside, and the cleaning fluid passes through the cylindrical member from the inside to the outer circumferential surface.

2. A substrate processing system comprising a substrate processing unit for processing a substrate with a processing liquid, and a processing liquid recovery passage for the processing liquid discharged from the substrate processing unit to flow through, the processing liquid recovery passage including a filter for removing foreign objects mixed in the processing liquid; a cleaning fluid supply passage for feeding a cleaning fluid for cleaning the filter; and a discharge passage for discharging the foreign objects and the cleaning fluid from the filter, wherein the filter includes a cylindrical member, a housing enclosing the filter member, an upper discharge passage for discharging the foreign objects and the cleaning fluid at the upper part of the housing, and a lower discharge passage for discharging the foreign objects and the cleaning fluid at a lower part of the housing.

3. The substrate processing system according to claim 1 or 2, wherein the filter is a cylindrical filter member; and the cylindrical filter member is formed in replaceable cartridges.

4. The substrate processing system according to claim 1 or 2 comprising an additional finer filter than said filter disposed downstream of said filter of the processing liquid recovery passage.

5. The substrate processing system according to claim 1 or 2, wherein the filter is a cylindrical filter member;

an additional filter of a cylindrical finer filter member than said filter is disposed inside said filter;

the processing liquid passes through the outer filter from the outer circumferential surface of the cylindrical filter member to the inside and passes the additional filter from the outer circumferential surface to the inside; and the cleaning fluid passes through the outer filter from the inside of the cylindrical member to the outer circumferential surface.

6. The substrate processing system according to claim 1 or 2, wherein the filter includes a supersonic vibrator or a sonic vibrator of a 10–100 Hz frequency.

7. The substrate processing system according to claim 1 or 2, wherein the filter includes a heater.

8. The substrate processing system according to claim 1 or 2, comprising a control unit for controlling a cleaning step for cleaning the filter, the control unit counts times of cleaning the filter, and outputs a message for replacing the filter when the times reach a prescribed number of times.

9. The substrate processing system according to claim 1 or 2, wherein the control unit commands the start of the cleaning step of cleaning the filter at a prescribed time interval.

10. The substrate processing system according to claim 1 or 2, wherein the filter includes a color sensor.

11. The substrate processing system according to claim 1 or 2, wherein the housing enclosing the filter has a window for visually observing the filter.

12. A substrate processing system comprising a substrate processing unit for processing a substrate with a processing liquid, and a plurality of processing liquid recovery passages for the processing liquid discharged from the substrate processing unit to flow through;

each of the plurality of processing liquid recovery passages includes a filter for removing foreign objects mixed in the processing liquid, a cleaning fluid supply passage for feeding a cleaning fluid for cleaning the filter, and a discharge passage for discharging the foreign objects and the cleaning fluid from the filter, wherein the processing liquid recovery passages are branched in parallel at an upstream portion of the filters with a change-over value inserted therein for diverting the processing liquid.

13. The substrate processing system according to claim 12, wherein each of the plurality of processing liquid recovery passages includes an additional finer filter than said filter disposed downstream of said filter.

14. The substrate processing system according to claim 12, wherein an additional finer filter than said filter is disposed downstream of said filter of each of the processing liquid recovery passages;

at least one additional processing liquid recovery passage is branched from a part of each of the processing liquid recovery passages between said filter and the change-over valve and is connected to a part of the processing liquid recovery passage between the filter and the additional filter, and the additional processing recovery passage includes a filter for removing foreign objects mixed in the processing liquid, a cleaning fluid supply passage for feeding a cleaning fluid for cleaning the filter of the additional processing recovery passage, and a discharge passage for discharging the foreign objects and the cleaning fluid from the filter of the additional processing recovery passage.

15. A substrate processing system comprising a substrate processing unit for processing a substrate with a processing liquid, and a processing liquid recovery passage for the processing liquid discharged from the substrate processing unit to flow through, the processing liquid recovery passage including a filter for removing foreign objects mixed in the processing liquid; a cleaning fluid supply passage for feeding a cleaning fluid for cleaning the filter; and a discharge passage for discharging the foreign objects and the cleaning fluid from the filter, wherein a liquid delivery pump for delivering the processing liquid to the filter is disposed upstream of the filter;

a pressure sensor for metering a pressure of the processing liquid and/or a flow sensor for metering a flow rate of the processing liquid is disposed between the liquid delivery pump and the filter, said system further comprising a control unit for starting a cleaning step of cleaning the filter when a pressure detected by the pressure sensor increases and/or a flow rate detected by the flow sensor decreases.

16. A substrate processing system comprising a substrate processing unit for processing a substrate with a processing liquid, and a processing liquid recovery passage for the processing liquid discharged from the substrate processing unit to flow through, the processing liquid recovery passage including a filter for removing foreign objects mixed in the processing liquid; a cleaning fluid supply passage for feeding a cleaning fluid for cleaning the filter; and a discharge passage for discharging the foreign objects and the cleaning fluid from the filter, wherein a pressure sensor and/or a flow sensor is disposed in the cleaning fluid supply passage, said system further comprising a control unit for stopping a cleaning step of cleaning the filter when a pressure detected by the pressure sensor decreases and/or a flow rate detected by the flow sensor increases.

17. A substrate processing method for processing a substrate with a processing liquid, passing the processing liquid discharged after the processing through a filter to remove foreign objects in the processing liquid, when the filter is stuffed with foreign objects, a cleaning fluid is gassed through the filter in a direction opposite to a direction of passage of the processing liquid to thereby release the foreign, comprising the step of discharging the cleaning fluid which has passed through the filter and the foreign objects released from the filter at an upper part of a housing enclosing the filter, and the step of discharging the cleaning fluid which has passed through the filter and the foreign objects released from the filter at a lower part of the housing.

18. The substrate processing method according to claim 17, comprises the step of discharging the cleaning fluid which has passed through the filter and the foreign objects released from the filter at an upper part of a housing enclosing the filter, and the step of discharging the cleaning fluid which has passed through the filter and the foreign objects released from the filter at a lower part of the housing, in the latter step, the processing liquid is delivered into the housing.

19. The substrate processing method according to claim 17, wherein the cleaning fluid is $N_2$, isopropyl alcohol (IPA) or pure water.

20. A substrate processing method for processing a substrate with a processing liquid, passing the processing liquid discharged after the processing through a filter to remove foreign objects in the processing liquid, when the filter is stuffed with foreign objects, a cleaning fluid is passed through the filter in a direction opposite to a direction of passage of the processing liquid to thereby release the foreign objects, wherein when a pressure of the processing liquid before passing through the filter increases or when a flow rate of the processing liquid decreases, the step of releasing the foreign objects on the filter is started.

21. A substrate processing method for processing a substrate with a processing liquid, passing the processing liquid discharged after the processing through a filter to remove foreign objects in the processing liquid, when the filter is stuffed with foreign objects, a cleaning fluid is passed through the filter in a direction opposite to a direction of passage of the processing liquid to thereby release the foreign objects, wherein when a pressure of the cleaning fluid before passing through the filter decreases or when a flow rate of the cleaning fluid increases, the step of releasing the foreign objects on the filter is stopped.

22. A substrate processing method for processing a substrate with a processing liquid, passing the processing liquid discharged after the processing through a filter to remove foreign objects in the processing liquid, when the filter is stuffed with foreign objects, a cleaning fluid is passed through the filter in a direction opposite to a direction of passage of the processing liquid to thereby release the foreign objects, wherein the cleaning fluid is a gas containing an organic solvent.

* * * * *